(12) United States Patent
Kikitsu et al.

(10) Patent No.: US 11,011,474 B2
(45) Date of Patent: May 18, 2021

(54) ELECTROMAGNETIC WAVE ATTENUATOR AND ELECTRONIC DEVICE

(71) Applicants: KABUSHIKI KAISHA TOSHIBA, Tokyo (JP); SHIBAURA MECHATRONICS CORPORATION, Yokohama (JP)

(72) Inventors: Akira Kikitsu, Kanagawa (JP); Yoshinari Kurosaki, Kanagawa (JP); Kenichiro Yamada, Tokyo (JP); Shigeki Matsunaka, Kanagawa (JP)

(73) Assignees: KABUSHIKI KAISHA TOSHIBA, Tokyo (JP); SHIBAURA MECHATRONICS CORPORATION, Yokohama (JP)

( * ) Notice: Subject to any disclaimer, the term of this patent is extended or adjusted under 35 U.S.C. 154(b) by 0 days.

(21) Appl. No.: 16/562,652

(22) Filed: Sep. 6, 2019

(65) Prior Publication Data

US 2020/0227358 A1    Jul. 16, 2020

(30) Foreign Application Priority Data

Jan. 11, 2019 (JP) .............................. JP2019-003740

(51) Int. Cl.
*H01L 23/552* (2006.01)
*H01F 10/30* (2006.01)
*H01F 10/14* (2006.01)
*H01F 10/16* (2006.01)

(52) U.S. Cl.
CPC .......... *H01L 23/552* (2013.01); *H01F 10/14* (2013.01); *H01F 10/16* (2013.01); *H01F 10/30* (2013.01)

(58) Field of Classification Search
None
See application file for complete search history.

(56) References Cited

U.S. PATENT DOCUMENTS

| 5,561,265 A * | 10/1996 | Livshits | ................. H01L 23/08 174/386 |
| 8,664,751 B2 * | 3/2014 | Kim | .................... H01L 25/0657 257/660 |
| 9,871,005 B2 * | 1/2018 | Lin | ........................ H01L 23/552 |
| 9,972,579 B1 * | 5/2018 | Kawabata | ............... H01L 25/50 |

(Continued)

FOREIGN PATENT DOCUMENTS

| JP | S61-237500 A | 10/1986 |
| JP | S62-256498 A | 11/1987 |

(Continued)

*Primary Examiner* — Evren Seven
(74) *Attorney, Agent, or Firm* — Finnegan, Henderson, Farabow, Garrett & Dunner L.L.P.

(57) ABSTRACT

According to one embodiment, an electromagnetic wave attenuator includes a plurality of magnetic layers, and a plurality of nonmagnetic layers. The plurality of nonmagnetic layers is conductive. A direction from one of the plurality of magnetic layers toward an other one of the plurality of magnetic layers is aligned with a first direction. One of the plurality of nonmagnetic layers is between the one of the plurality of magnetic layers and the other one of the plurality of magnetic layers. A first thickness along the first direction of the one of the plurality of magnetic layers is not less than ½ times a second thickness along the first direction of the one of the plurality of nonmagnetic layers.

20 Claims, 16 Drawing Sheets

(56) References Cited

U.S. PATENT DOCUMENTS

| | | | |
|---|---|---|---|
| 10,242,954 B2* | 3/2019 | Kawabata | H01L 23/552 |
| 2002/0018919 A1* | 2/2002 | Saito | G11B 5/31 |
| | | | 428/831.2 |
| 2005/0162249 A1 | 7/2005 | Simola | |
| 2010/0140759 A1* | 6/2010 | Pagaila | H01L 21/565 |
| | | | 257/660 |
| 2010/0276791 A1* | 11/2010 | Kaneko | H01L 23/5227 |
| | | | 257/659 |
| 2013/0256819 A1 | 10/2013 | Watanabe et al. | |
| 2014/0299810 A1* | 10/2014 | Wang | C23C 8/26 |
| | | | 252/62.55 |
| 2014/0374860 A1* | 12/2014 | Suzuki | H01L 27/228 |
| | | | 257/422 |
| 2017/0250134 A1* | 8/2017 | Sturcken | H01F 41/0206 |
| 2018/0205142 A1 | 7/2018 | Jung et al. | |
| 2018/0337139 A1* | 11/2018 | Kikitsu | H01L 23/552 |
| 2019/0081007 A1* | 3/2019 | Iwasaki | H01L 23/3121 |
| 2019/0267301 A1 | 8/2019 | Yazaki | |
| 2020/0058429 A1* | 2/2020 | Suzuki | C22C 38/10 |
| 2020/0082966 A1* | 3/2020 | Suzuki | H01F 10/14 |
| 2020/0243457 A1* | 7/2020 | Kikitsu | H01L 23/552 |

FOREIGN PATENT DOCUMENTS

| | | |
|---|---|---|
| JP | H2-172299 A | 7/1990 |
| JP | H7-249888 A | 9/1995 |
| JP | 2000-63999 A | 2/2000 |
| JP | 2003-23286 A | 1/2003 |
| JP | 2005-514797 A | 5/2005 |
| JP | 2009-239021 A | 10/2009 |
| JP | 2012-33764 A | 2/2012 |
| JP | 2012-38807 A | 2/2012 |
| JP | 2013-153041 A | 8/2013 |
| JP | 2013-207059 A | 10/2013 |
| JP | 2015-8216 A | 1/2015 |
| JP | 2017-143210 A | 8/2017 |
| JP | 2018-195660 A | 12/2018 |
| JP | 2019-54059 A | 4/2019 |
| KR | 10-2008-0049103 A | 6/2008 |
| KR | 10-1772871 B1 | 8/2017 |
| WO | WO 2018/105307 A1 | 6/2018 |

\* cited by examiner

ELECTROMAGNETIC WAVE ATTENUATOR AND ELECTRONIC DEVICE

CROSS-REFERENCE TO RELATED APPLICATIONS

This application is based upon and claims the benefit of priority from Japanese Patent Application No. 2019-003740, filed on Jan. 11, 2019; the entire contents of which are incorporated herein by reference.

FIELD

Embodiments described herein relate generally to an electromagnetic wave attenuator and an electronic device.

BACKGROUND

For example, an electromagnetic wave attenuator such as an electromagnetic shield sheet or the like has been proposed. There is an electronic device that includes the electromagnetic wave attenuator and a semiconductor element. It is desirable to improve the attenuation characteristics for electromagnetic waves of the electromagnetic wave attenuator.

DETAILED DESCRIPTION

Figure 1A:
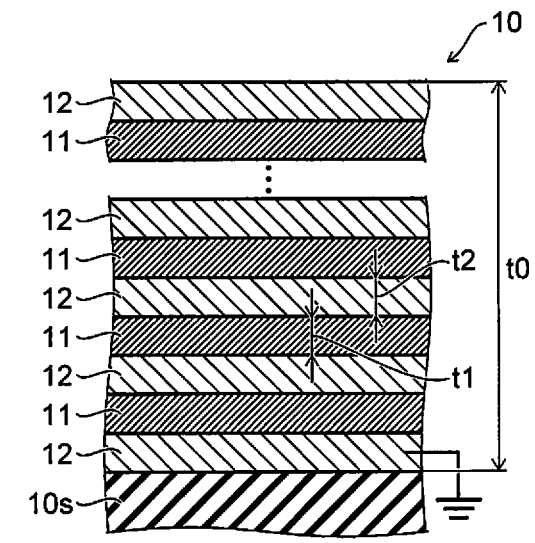
FIG. 1A to FIG. 1C are schematic views illustrating an electromagnetic wave attenuator according to a first embodiment.

According to one embodiment, an electromagnetic wave attenuator includes a plurality of magnetic layers, and a plurality of nonmagnetic layers. The plurality of nonmagnetic layers is conductive. A direction from one of the plurality of magnetic layers toward an other one of the plurality of magnetic layers is aligned with a first direction. One of the plurality of nonmagnetic layers is between the one of the plurality of magnetic layers and the other one of the plurality of magnetic layers. A first thickness along the first direction of the one of the plurality of magnetic layers is not less than ½ times a second thickness along the first direction of the one of the plurality of nonmagnetic layers. A number of the plurality of magnetic layers is 3 or more.

According to one embodiment, an electronic device includes the electromagnetic wave attenuator described above and an electronic element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
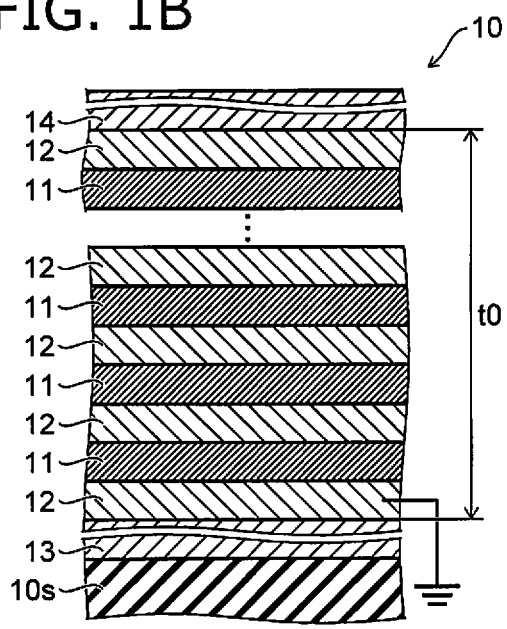
Figure 1C:
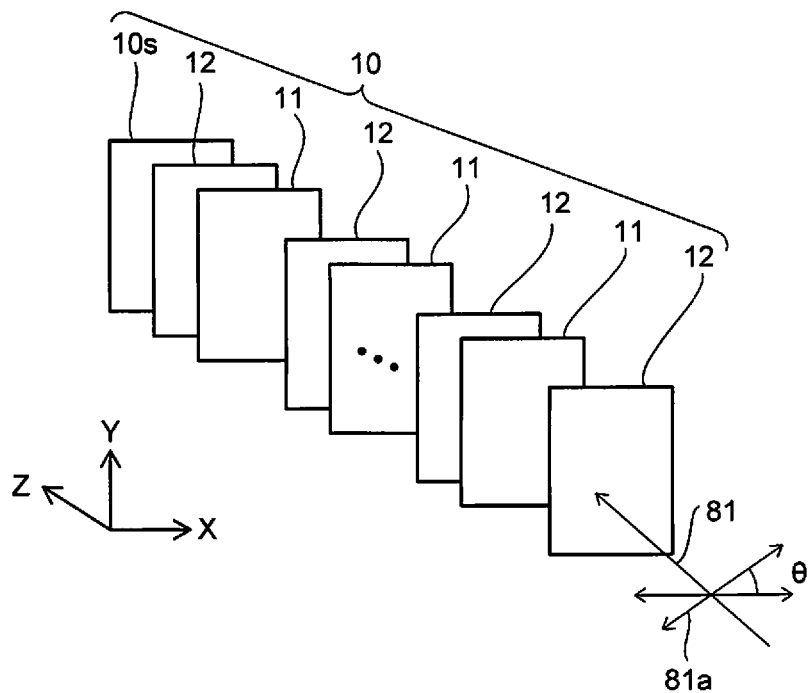

FIG. 1A to FIG. 1C are schematic views illustrating an electromagnetic wave attenuator according to a first embodiment.

In FIG. 1C, the positions of multiple layers are illustrated as being shifted for easier viewing of the drawing.

As shown in FIG. 1A and FIG. 1C, the electromagnetic wave attenuator 10 according to the embodiment includes multiple magnetic layers 11 and multiple conductive nonmagnetic layers 12. The multiple magnetic layers 11 and the multiple nonmagnetic layers 12 are provided alternately along a first direction. The orientation from one of the multiple magnetic layers 11 toward an other one of the multiple magnetic layers 11 is aligned with the first direction. For example, the multiple magnetic layers 11 are arranged along the first direction. The orientation from one of the multiple nonmagnetic layers 12 toward an other one of the multiple nonmagnetic layers 12 is aligned with the first direction. For example, the multiple nonmagnetic layers 12 are arranged along the first direction. One of the multiple nonmagnetic layers 12 is between one of the multiple magnetic layers 11 and an other one of the multiple magnetic layers 11. One of the multiple magnetic layers 11 is between one of the multiple nonmagnetic layers 12 and an other one of the multiple nonmagnetic layers 12.

The first direction is taken as a Z-axis direction. One direction perpendicular to the Z-axis direction is taken as an X-axis direction. A direction perpendicular to the Z-axis direction and the X-axis direction is taken as a Y-axis direction.

For example, at least a portion of the multiple magnetic layers 11 is parallel to the X-Y plane. For example, at least a portion of the multiple nonmagnetic layers 12 is parallel to the X-Y plane.

As shown in FIG. 1A, the electromagnetic wave attenuator 10 may include a base body 10s. For example, the multiple magnetic layers 11 and the multiple nonmagnetic layers 12 are formed alternately on the base body 10s.

A conductive layer 13, a conductive layer 14, etc., may be further provided as shown in FIG. 1B. For example, the conductive layer 13 contacts the base body 10s. The conductive layer 13 contacts one of the magnetic layer 11 or the nonmagnetic layer 12. For example, the conductive layer 13 may function as a foundation layer. The adhesion force between the base body 10s and the one of the magnetic layer 11 or the nonmagnetic layer 12 may be increased by the conductive layer 13. For example, the multiple magnetic layers 11 and the multiple nonmagnetic layers 12 are provided between the conductive layer 13 and the conductive layer 14. For example, the conductive layer 14 may function as a protective layer. For example, the thicknesses of the conductive layer 13 and the conductive layer 14 each may be 100 nm or more. The conductive layer 13 and the conductive layer 14 may include stainless steel, Cu, etc. The conductive layer 13 and the conductive layer 14 may be magnetic or nonmagnetic.

In one example of the embodiment, the base body 10s is a mold resin or the like. In the other example, the base body 10s may be a resin layer or the like. For example, the resin layer is provided on a plastic sheet. In the embodiment, the surface of the base body 10s may have an unevenness. In such a case, as described below, the multiple magnetic layers 11 and the multiple nonmagnetic layers 12 may have uneven configurations along the unevenness.

As shown in FIG. 1A, the thickness of one of the multiple magnetic layers 11 is taken as a first thickness t1. The thickness of one of the multiple nonmagnetic layers 12 is taken as a second thickness t2.

In the embodiment, the first thickness t1 of the at least one of the multiple magnetic layers 11 is not less than ½ times the second thickness t2 of the at least one of the multiple nonmagnetic layers 12. For example, the second thickness t2 may be the same as the first thickness t1. The second thickness t2 is not more than 2 times the first thickness t1. The first thickness t1 and the second thickness t2 are lengths along the first direction (the Z-axis direction).

In the embodiment, the number of the multiple magnetic layers 11 is 3 or more. In one example, the number of the multiple nonmagnetic layers 12 is the same as the number of the multiple magnetic layers 11. The difference between the number of the multiple nonmagnetic layers 12 and the number of the multiple magnetic layers 11 may be 1 or −1. The number of the multiple magnetic layers 11 may be, for example, 5 or more.

As shown in FIG. 1C, an electromagnetic wave 81 is incident on the electromagnetic wave attenuator 10 having such a configuration. In the embodiment, it was found that the electromagnetic wave 81 in the band of 200 MHz or less can be attenuated effectively. For example, the electromagnetic wave attenuator 10 can be used as an electromagnetic wave shield body. For example, at least one of the multiple magnetic layers 11 and/or the multiple nonmagnetic layers 12 is grounded (referring to FIG. 1A).

Examples of measurement results of characteristics of the electromagnetic wave attenuator will now be described.

In the measurements, the electromagnetic wave 81 is incident on the electromagnetic wave attenuator 10 along the Z-axis direction (referring to FIG. 1C).

FIG. 2A, FIG. 2B, FIG. 3A, and FIG. 3B are graphs illustrating characteristics of the electromagnetic wave attenuator.

Figure 2A:
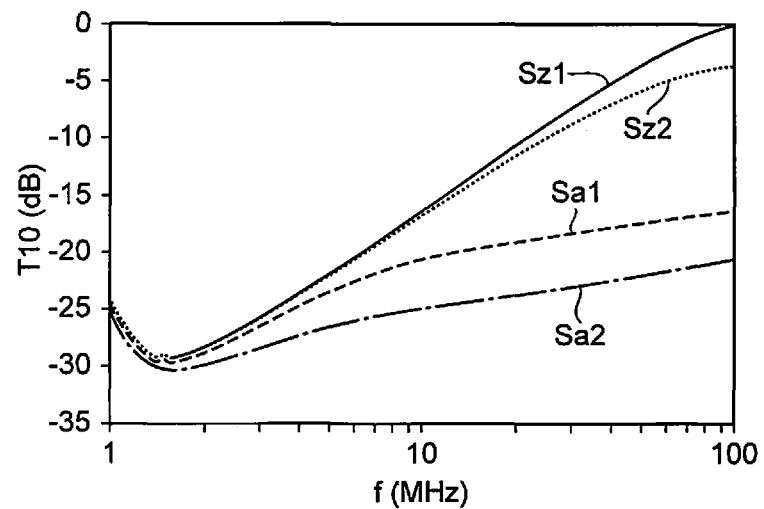
FIG. 2A and FIG. 2B are graphs illustrating characteristics of the electromagnetic wave attenuator.
Figure 2B:
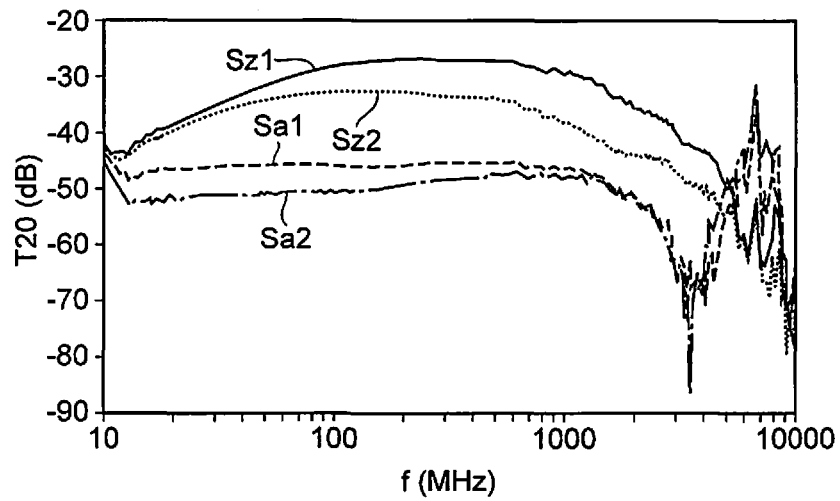
Figure 3A:
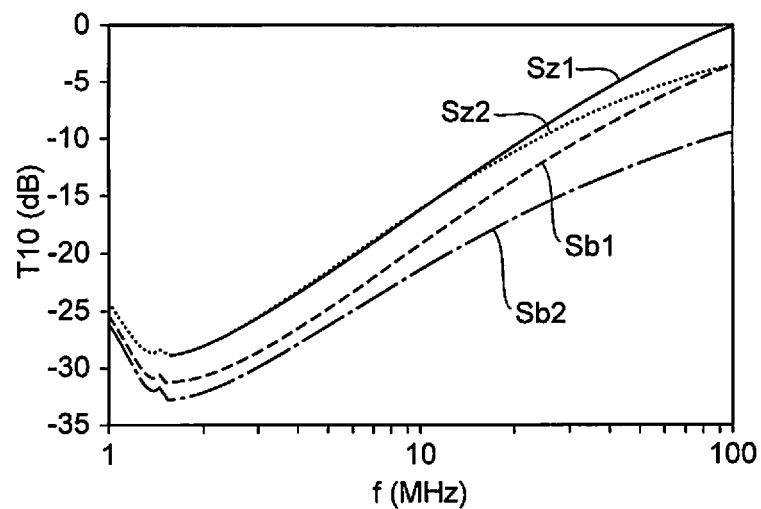
FIG. 3A and FIG. 3B are graphs illustrating characteristics of the electromagnetic wave attenuator.
Figure 3B:
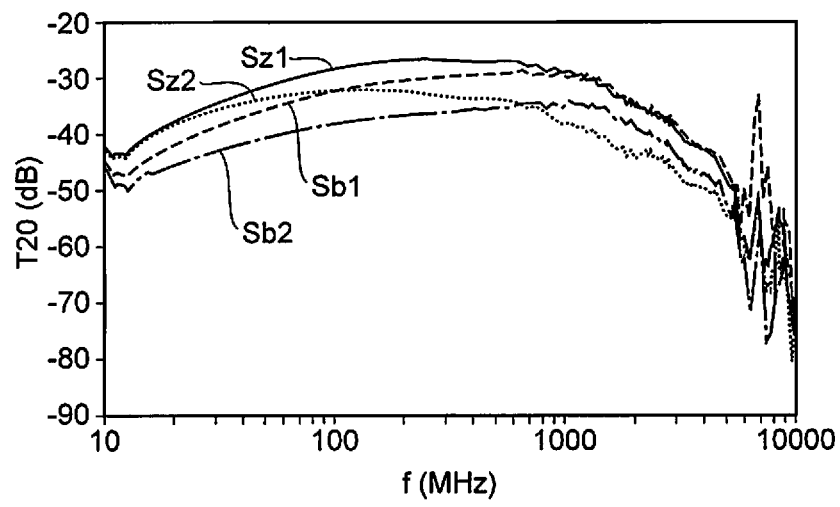

These figures illustrate the measurement results of the characteristics of an electromagnetic wave passing through the electromagnetic wave attenuator when the electromagnetic wave 81 is incident on the electromagnetic wave attenuator. In these figures, the horizontal axis is a frequency f (MHz) of the electromagnetic wave 81. FIG. 2A and FIG. 3A show characteristics at low frequencies (1 MHz to 100 MHz). FIG. 2B and FIG. 3B show characteristics at high frequencies (10 MHz to 10000 MHz). Relative characteristics are described hereinbelow for the electromagnetic wave passing through the electromagnetic wave attenuator because the configuration of the device (including the gain of the amplifier, etc.) that is used is different between the measurements at the low frequencies and the measurements at the high frequencies. In FIG. 2A and FIG. 3A, the vertical axis is a transmission characteristic T10 (dB) of the electromagnetic wave 81. In FIG. 2B and FIG. 3B, the vertical axis is a transmission characteristic T20 (dB) of the electromagnetic wave 81. A low transmission characteristic T10 and a low transmission characteristic T20 (the absolute values being large) each correspond to a large amount of the attenuation of the electromagnetic wave 81 incident on the electromagnetic wave attenuator. It is desirable for the transmission characteristic T10 and the transmission characteristic T20 to be low (to have large absolute values).

FIG. 2A and FIG. 2B show the results of samples Sa1, Sa2, Sz1, and Sz2.

In the sample Sa1 and the sample Sa2, a set of the magnetic layer 11 and the nonmagnetic layer 12 is provided. In one set, the magnetic layer 11 is a NiFeCuMo layer having a thickness (the first thickness t1) of 100 nm. In one set, the nonmagnetic layer 12 is a Cu layer having a thickness (the second thickness t2) of 100 nm.

In the sample Sa1, a number Ns of sets including one magnetic layer 11 and one nonmagnetic layer 12 is 10. In the sample Sa2, the number Ns of sets including one magnetic layer 11 and one nonmagnetic layer 12 is 20.

In the sample Sz1, a NiFeCuMo layer that has a thickness of 2 μm is used as the electromagnetic wave attenuator. In the sample Sz2, a NiFeCuMo layer that has a thickness of 4 μm is used as the electromagnetic wave attenuator. In the samples Sz1 and Sz2, only the magnetic layer is provided as the electromagnetic wave attenuator; and a nonmagnetic layer is not provided.

FIG. 3A and FIG. 3B show the results of samples Sb1 and Sb2 in addition to the samples Sz1 and Sz2 recited above.

In the sample Sb1 and the sample Sb2, a set of the magnetic layer 11 and the nonmagnetic layer 12 is provided. In one set, the magnetic layer 11 is a NiFeCuMo layer having a thickness (the first thickness t1) of 50 nm. In one set, the nonmagnetic layer 12 is a Ta layer having a thickness (the second thickness t2) of 5 nm.

In the sample Sb1, the number Ns of sets including one magnetic layer 11 and one nonmagnetic layer 12 is 37. In the sample Sb2, the number Ns of sets including one magnetic layer 11 and one nonmagnetic layer 12 is 73.

In the samples Sa1, Sa2, Sb1, Sb2, Sz1, and Sz2, the NiFeCuMo layer or the sets of the multiple magnetic layers 11 and the multiple nonmagnetic layers 12 are formed on a resin substrate (the base body 10s). In these samples, the surface of the resin substrate has an unevenness having a height of about 0.5 µm. The NiFeCuMo layer or the sets of the multiple magnetic layers 11 and the multiple nonmagnetic layers 12 have uneven configurations along the unevenness.

As shown in FIG. 2A and FIG. 2B, a low transmission characteristic T10 and a low transmission characteristic T20 are obtained for the samples Sa1 and Sa2 compared to the samples Sz1 and Sz2 in which the nonmagnetic layer is not provided. For example, the transmission characteristic T10 and the transmission characteristic T20 of the samples Sa1 and Sa2 are low in the region of 1000 MHz or less. In particular, the transmission characteristic T10 and the transmission characteristic T20 of the samples Sa1 and Sa2 are low in the wide frequency domain of 10 MHz to 500 MHz.

As shown in FIG. 3A and FIG. 3B, a low transmission characteristic T10 and a low transmission characteristic T20 are obtained also for the samples Sb1 and Sb2 compared to the samples Sz1 and Sz2 in which the nonmagnetic layer is not provided. For example, the transmission characteristic T10 and the transmission characteristic T20 of the samples Sb1 and Sb2 are low in the region of 1000 MHz or less. In particular, the transmission characteristic T10 and the transmission characteristic T20 of the samples Sb1 and Sb2 are low in the region of 2 MHz to 100 MHz. Compared to the samples Sa1 and Sa2, the samples Sb1 and Sb2 have excellent transmission characteristics in the frequency domain of 2 MHz to 5 MHz.

For the samples Sz1 and Sz2 as shown in FIG. 2A, the transmission characteristic T10 increases greatly as the frequency f increases. From this result, it is considered that in the samples Sz1 and Sz2, the incident electromagnetic wave 81 generates an eddy current in the NiFeCuMo layer; and the eddy current causes the effect of attenuating the electromagnetic wave 81.

On the other hand, it is known that the attenuation characteristics for the electromagnetic wave 81 improve when the electromagnetic wave 81 is incident on an electromagnetic wave attenuator including stacked multiple magnetic layers and multiple nonmagnetic conductive layers. It is generally considered that multiple reflections of the electromagnetic wave 81 due to the impedance difference at the interface between the magnetic layer and the nonmagnetic conductive layer occur in superimposition with the eddy current loss of the nonmagnetic conductive layer. The reflectance at the interface increases as the permeability of the magnetic layer 11 increases. The attenuation characteristics improve at the frequency vicinity where ferromagnetic resonance is generated because the permeability of the magnetic layer 11 increases. Generally, the frequency f where ferromagnetic resonance is generated for a normal magnetic body is 300 MHz or more. It is difficult to obtain a ferromagnetic resonant frequency less than 300 MHz.

An example of a simulation of the attenuation characteristics for the electromagnetic wave 81 will now be described. In the model of the simulation, the electromagnetic wave 81 attenuates due to the superimposition on the eddy current loss of the nonmagnetic conductive layer of the reflection of the electromagnetic wave 81 due to the impedance difference at the interface between the magnetic layer and the nonmagnetic layer.

Figure 4:
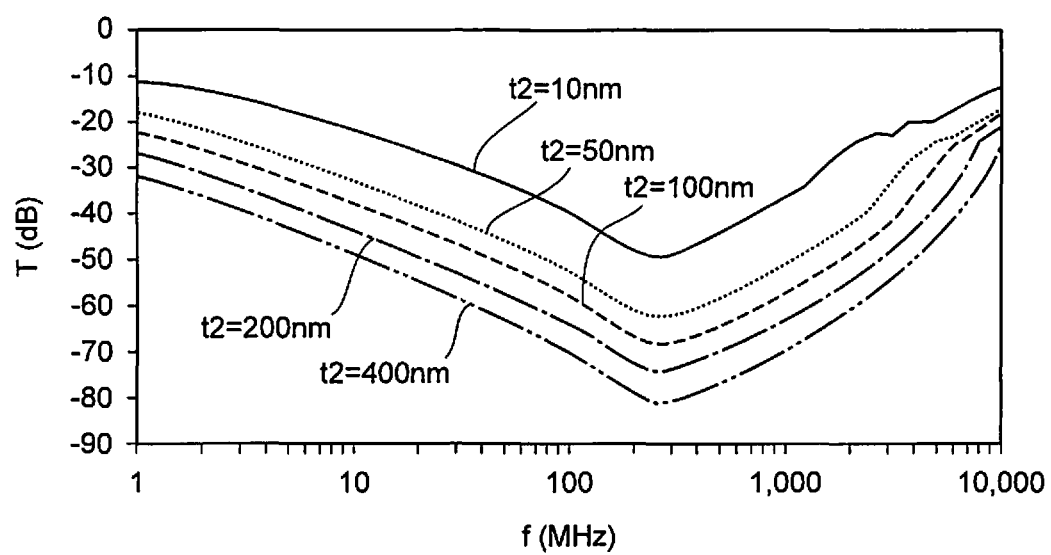
FIG. 4 is a graph illustrating the simulation results of the characteristics of the electromagnetic wave attenuator.

FIG. 4 is a graph illustrating the simulation results of the characteristics of the electromagnetic wave attenuator.

The Schelkunoff formula is used in the simulation of FIG. 4. The electromagnetic wave attenuation of a multilayer film can be analyzed by this formula. Generally, this formula is used widely as a description of the behavior of the electromagnetic wave 81 attenuated due to effects of the impedance difference at the interface between the magnetic layer and the nonmagnetic layer. In the model of the simulation of FIG. 4, the physical property values of characteristics near NiFeCuMo using a NiFe layer as a reference are applied to the magnetic layer 11. The thickness (the first thickness t1) of the magnetic layer 11 is 100 nm. Physical property values of Cu are applied to the nonmagnetic layer 12; and the thickness (the second thickness t2) of the nonmagnetic layer 12 is modified in the range of 10 nm to 400 nm. The number Ns of sets including one magnetic layer 11 and one nonmagnetic layer 12 is 10. In FIG. 4, the horizontal axis is the frequency f (MHz). The vertical axis is a transmission characteristic T (dB). The values of the vertical axis are adjusted to correspond to the settings of the device configuration, the amplifier, etc., used in the experiment recited above.

As shown in FIG. 4, in a simulation considering the attenuation caused by the impedance difference at the interface between the magnetic layer and the nonmagnetic layer, the transmission characteristic T has a bottom (a minimum value). The frequency f that corresponds to the bottom is about 300 MHz. The frequency f corresponds to a frequency f generated by ferromagnetic resonance.

Conversely, for the samples Sa1, Sa2, Sb1, and Sb2 as described in reference to FIG. 2A, FIG. 2B, FIG. 3A, and FIG. 3B, the transmission characteristic T10 and the transmission characteristic T20 are low particularly in the region of 200 MHz or less. The configuration when the second thickness t2 is 100 nm in FIG. 4 corresponds to the configuration of the sample Sa1. The characteristic in FIG. 4 when the second thickness t2 is 100 nm is much different from the characteristic (the transmission characteristic T20) of the sample Sa1 shown in FIG. 2B. The characteristic in FIG. 4 when the second thickness t2 is 100 nm is much different from the characteristic (the transmission characteristic T10) of the sample Sa1 shown in FIG. 2A.

Therefore, it is considered that the characteristics observed for the samples Sa1, Sa2, Sb1, and Sb2 are not due to a generally-known phenomenon (i.e., the phenomenon caused by the superimposition on the eddy current loss of the nonmagnetic conductive layer of the impedance difference at the interface between the magnetic layer and the nonmagnetic layer).

The low transmission characteristic obtained at the low frequencies f of 200 MHz or less cannot be explained by ferromagnetic resonance. It is considered that the attenuation at low frequencies f is caused by an effect that is different from ferromagnetic resonance. For example, there is a possibility that domain wall regions (and magnetic domains) are provided in the multiple magnetic layers 11; and the attenuation at low frequencies f is caused by an interaction between the domain wall regions of many layers.

It can be seen from FIG. 4 that the transmission characteristic T is low (has a large absolute value) when the thickness (the second thickness t2) of the conductive nonmagnetic layer is thick. It is natural that the transmission characteristic T is low when the second thickness t2 is thick when the transmission characteristic T is based on the mechanism of the multiple reflections due to the impedance difference at the interface between the magnetic layer and the nonmagnetic layer being superimposed onto the attenuation characteristics for the electromagnetic wave 81 by the conductive nonmagnetic layer due to the eddy current. Accordingly, in an approach based on the general understanding, it is favorable to set the thickness (the second thickness t2) of the nonmagnetic layer 12 to be thick. Ordinarily, based on the approach recited above, for example, it is considered to be favorable for the second thickness t2 (e.g., 400 nm) to be not less than 4 times the first thickness t1 (e.g., 100 nm).

Conversely, in the embodiment, an effect that is different from conventionally known effects is employed. Therefore, in the embodiment, the first thickness t1 may be not less than ½ times the second thickness t2. For example, the second thickness t2 may be thin, e.g., not more than 2 times the first thickness t1. Thus, even in the case where a thin nonmagnetic layer 12 is used, a low transmission characteristic is obtained at low frequencies f. According to the embodiment, an electromagnetic wave attenuator can be provided in which the attenuation characteristics for electromagnetic waves can be improved. For example, by using a thin nonmagnetic layer 12, a low transmission characteristic is obtained not only in the frequency domain exceeding 200 MHz but also for low frequencies f (e.g., 1 MHz to 100 MHz) at which it is difficult to obtain a low transmission characteristic using conventional art.

FIG. 5A to FIG. 5D and FIG. 6A to FIG. 6D are graphs illustrating characteristics of the electromagnetic wave attenuator.

FIG. 5A to FIG. 5D show the characteristics of a sample Sa3 and a sample Sa4 in addition to the samples Sz1, Sz2, Sa1, and Sa2. In the sample Sa3, the number Ns is 3. In the sample Sa4, the number Ns is 5. Otherwise, the configurations of the samples Sa3 and Sa4 are similar to those of the sample Sa1 or Sa2.

FIG. 6A to FIG. 6D show the characteristics of a sample Sb3 and a sample Sb4 in addition to the samples Sz1, Sz2, Sb1, and Sb2. In the sample Sb3, the number Ns is 9. In the sample Sb4, the number Ns is 18. Otherwise, the configurations of the samples Sb3 and Sb4 are similar to those of the sample Sb1 or Sb2.

In these figures, the horizontal axis is the number Ns of sets including one magnetic layer 11 and one nonmagnetic layer 12. In these figures, the characteristics of the samples Sz1 and Sz2 are shown at the position where the number Ns is 1.

Figure 5A:
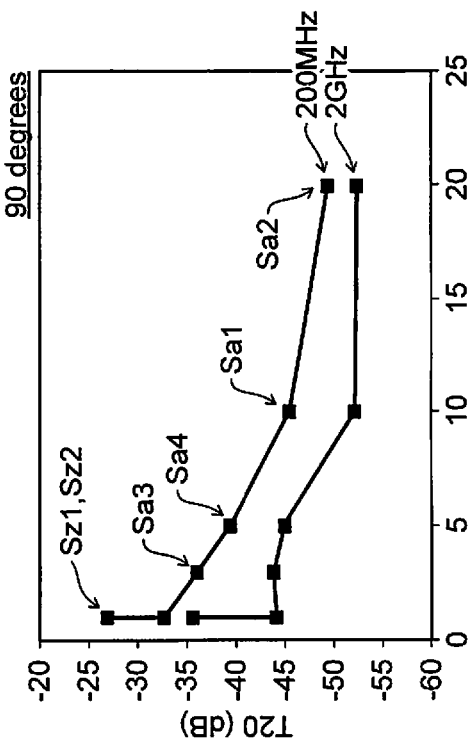
FIG. 5A to FIG. 5D are graphs illustrating characteristics of the electromagnetic wave attenuator.
Figure 5C:
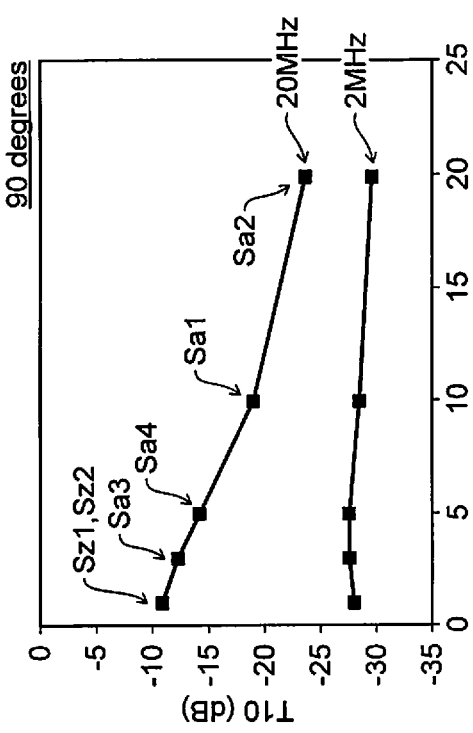
Figure 5B:
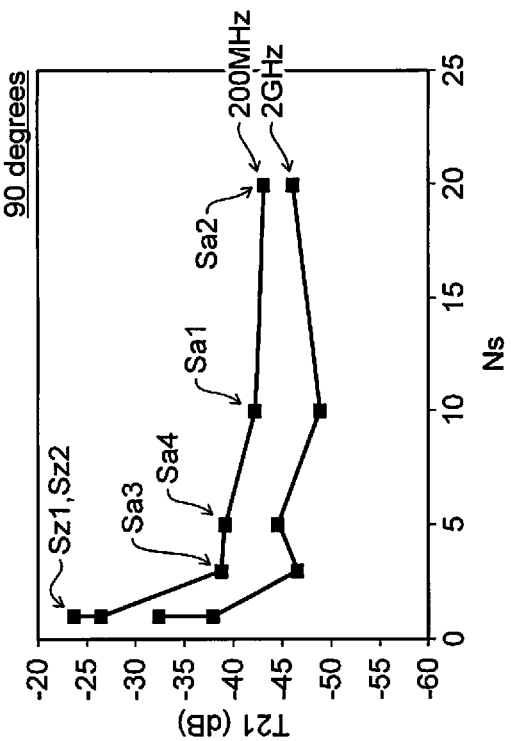
Figure 5D:
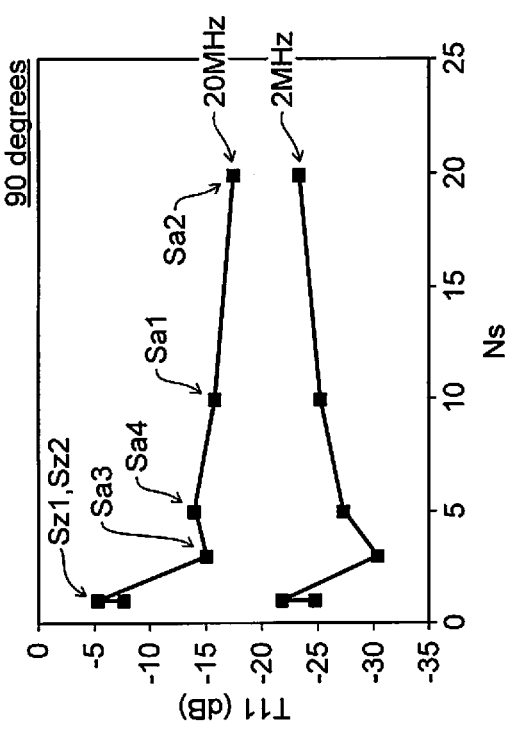
Figure 6A:
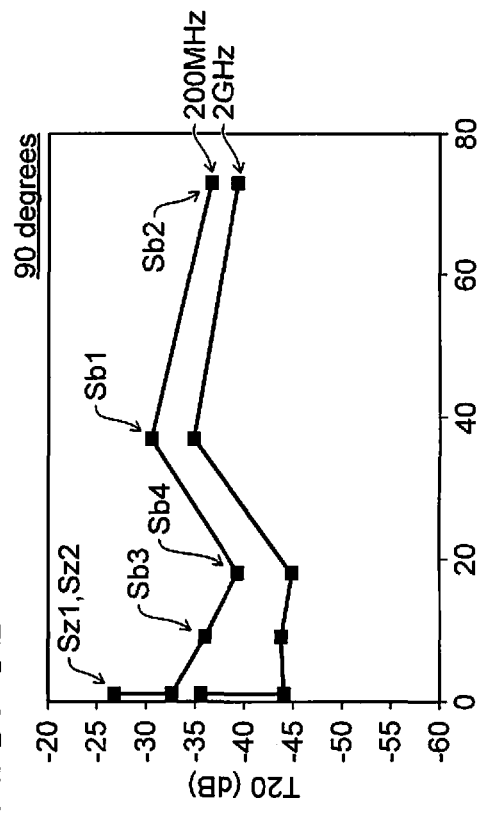
FIG. 6A to FIG. 6D are graphs illustrating characteristics of the electromagnetic wave attenuator.
Figure 6C:
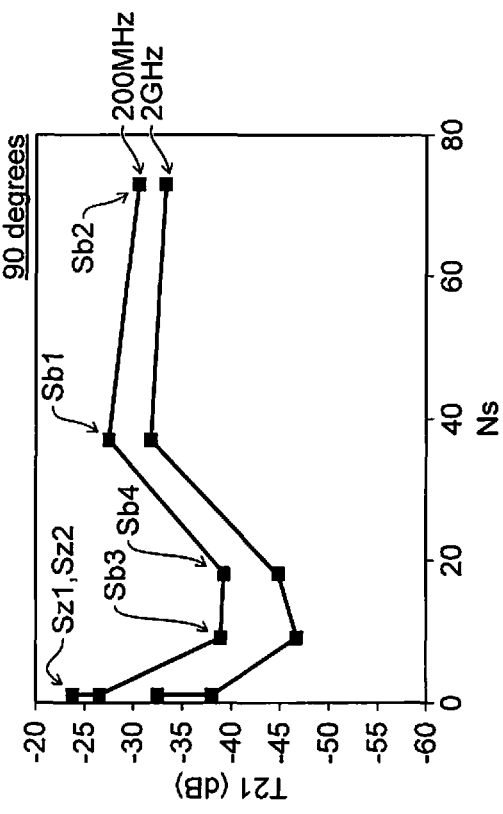
Figure 6B:
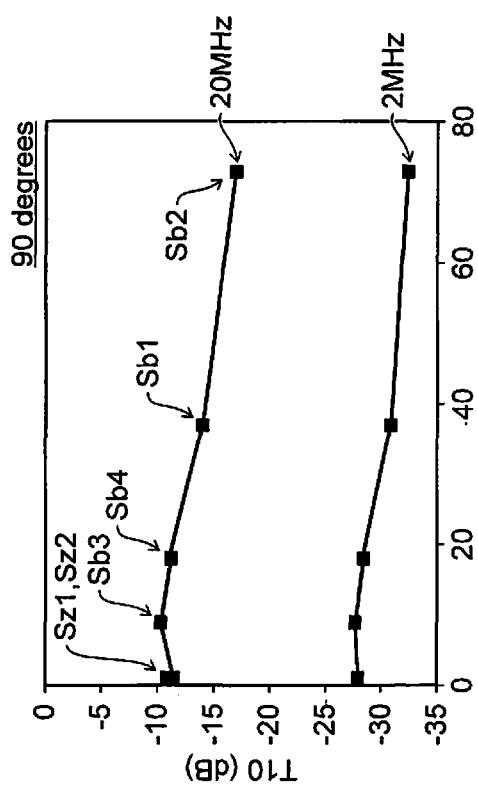
Figure 6D:
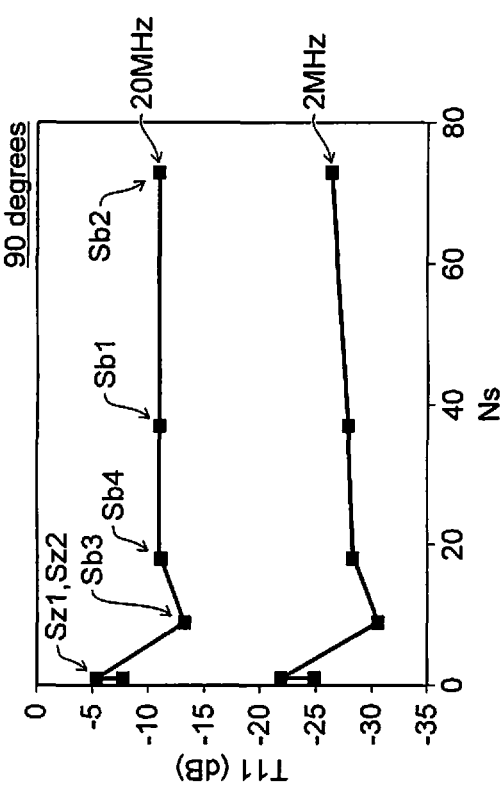

In FIG. 5A and FIG. 6A, the vertical axis is the transmission characteristic T10. In FIG. 5B and FIG. 6B, the vertical axis is the transmission characteristic T20. In FIG. 5C and FIG. 6C, the vertical axis is a normalized transmission characteristic T11. In FIG. 5D and FIG. 6D, the vertical axis is a normalized transmission characteristic T21. Generally, the transmission characteristic increases (has a large absolute value) as the thickness of the electromagnetic wave attenuator increases. The normalized transmission characteristic T11 is the value when the value of the transmission characteristic T10 is converted to the case of a total thickness of 1 µm. The normalized transmission characteristic T21 is the value when the value of the transmission characteristic T20 is converted to the case of a total thickness of 1 µm.

It can be seen from FIG. 5A to FIG. 5D that the transmission characteristics T10 and T20 decrease as the number Ns increases when the frequency f is 2 GHz, 200 MHz, and 20 MHz. When the number Ns is 3 or more, the transmission characteristics T10 and T20 decrease abruptly. In the embodiment, it is favorable for the number Ns to be 3 or more. It is favorable for the number Ns to be 5 or more.

It can be seen from FIG. 6A to FIG. 6D that the transmission characteristics T10 and T20 decrease as the number Ns increases when the frequency f is 2 GHz, 200 MHz, and 20 MHz. For example, when the number Ns is 9 or more, the transmission characteristics T10 and T20 decrease abruptly. In the embodiment, it is favorable for the number Ns to be 9 or more. It is favorable for the number Ns to be 18 or more.

In the embodiment, the nonmagnetic layer 12 that is provided between the multiple magnetic layers 11 is thin. Therefore, it is considered that a magnetostatic interaction is generated between the multiple magnetic layers 11. The magnetostatic interaction can be increased effectively by increasing the number Ns.

In the embodiment, the surfaces of the multiple magnetic layers 11 may have an unevenness. An example of an unevenness will now be described.

Figure 7:
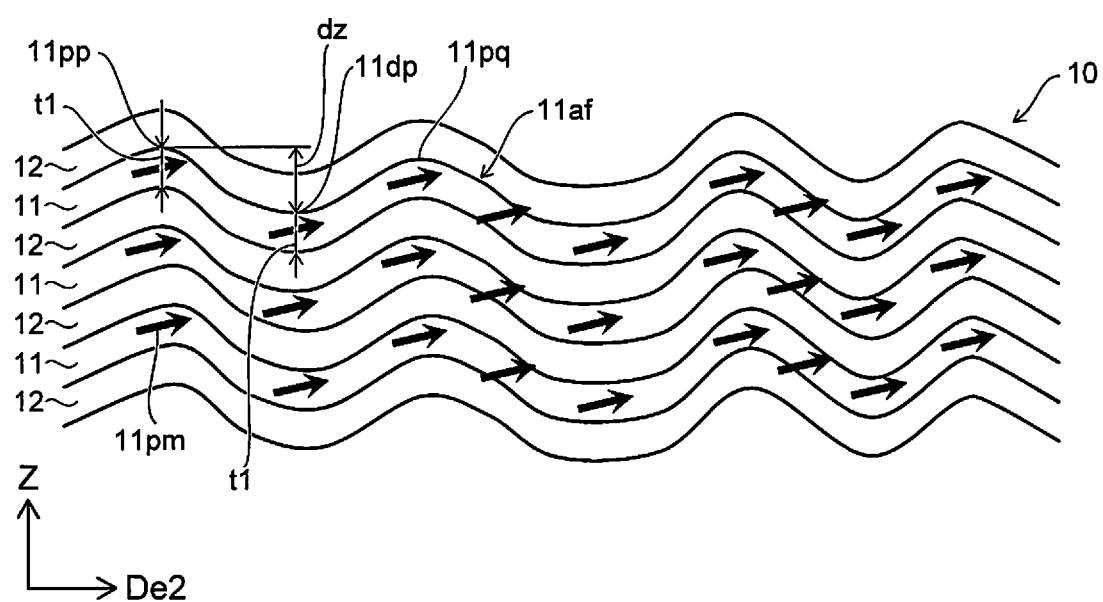
FIG. 7 is a schematic cross-sectional view illustrating the electromagnetic wave attenuator.

FIG. 7 is a schematic cross-sectional view illustrating the electromagnetic wave attenuator.

FIG. 7 schematically shows the cross section when the electromagnetic wave attenuator 10 is cut by a plane including the Z-axis direction. As shown in FIG. 7, the multiple magnetic layers 11 and the multiple nonmagnetic layers 12 are provided alternately along the Z-axis direction. For example, the nonmagnetic layer 12 is provided along the unevenness of the magnetic layer 11. For example, the magnetic layer 11 is provided along the unevenness of the nonmagnetic layer 12.

For example, one of the multiple magnetic layers 11 has a first surface 11af. The first surface 11af opposes one of the multiple nonmagnetic layers 12. The first surface 11af includes a first top portion 11pp and a first bottom portion 11dp. A distance dz along the first direction (the Z-axis direction) between the first top portion 11pp and the first bottom portion 11dp corresponds to the height (or the depth) of the unevenness of the first surface 11af. In the embodiment, the distance dz is, for example, 10 nm or more.

Because the first surface 11af includes the unevenness, for example, multiple convex portions or multiple concave portions are provided in one magnetic layer 11. The multiple convex portions are arranged in a plane (e.g., the X-Y plane) crossing the Z-axis direction. Magnetizations 11pm of the multiple convex portions interact. For example, because the nonmagnetic portion exists in the plane crossing the Z-axis direction, a magnetostatic coupling interaction is generated at the multiple convex portions between the multiple magnetizations 11pm at a relatively long distance. The multiple concave portions are arranged in a plane (e.g., the X-Y plane) crossing the Z-axis direction. The magnetizations 11pm of the multiple concave portions interact. For example, because the nonmagnetic portion exists in the plane crossing the Z-axis direction, a magnetostatic coupling interaction is generated at the multiple concave portions between the multiple magnetizations 11pm at a relatively long distance.

In the embodiment, the nonmagnetic layer 12 that is provided between the multiple magnetic layers 11 is thin. Therefore, it is considered that the magnetostatic interaction between the multiple convex portions arranged in the Z-axis direction is strengthened. It is considered that the magnetostatic interaction between the multiple concave portions arranged in the Z-axis direction is strengthened.

Thus, because the first surface 11af has the unevenness, in addition to the magnetostatic interaction generated between the multiple magnetic layers 11, a magnetostatic interaction is generated between the convex portions included in one magnetic layer 11; and a magnetostatic interaction is generated between the concave portions included in one magnetic layer 11. For example, magnetostatic interactions are generated effectively in a direction along the Z-axis direction and in directions crossing the Z-axis direction. The incident electromagnetic wave 81 can be attenuated efficiently thereby.

As shown in FIG. 7, one of the multiple magnetic layers 11 has the first surface 11af opposing one of the multiple nonmagnetic layers 12. The first surface 11af includes the first top portion 11pp, a second top portion 11pq, and the first bottom portion 11dp. One direction crossing the first direction (the Z-axis direction) is taken as a second direction De2. The position of the first bottom portion 11dp in the second direction De2 is between the position of the first top portion 11pp in the second direction De2 and the position of the second top portion 11pq in the second direction De2. At least a portion of one of the multiple nonmagnetic layers 12 is between the first top portion 11pp and the second top portion 11pq in the second direction De2.

For example, a magnetostatic interaction is generated between the portion including the first top portion 11pp and the portion including the second top portion 11pq. The incident electromagnetic wave 81 can be attenuated efficiently.

In the embodiment, the distance dz is not less than 0.2 times the second thickness t2. Thereby, the unevenness is maintained in the multiple magnetic layers 11 and the multiple nonmagnetic layers 12. The distance dz is not less than 0.2 times the first thickness t1. Thereby, the unevenness is maintained in the multiple magnetic layers 11 and the multiple nonmagnetic layers 12. For example, the unevenness becomes planarized easily if an excessively thick nonmagnetic layer 12 or an excessively thick magnetic layer 11 is provided.

In the embodiment, the distance dz may be, for example, 10 µm or less.

FIG. 8A to FIG. 8D are schematic views illustrating the electromagnetic wave attenuator.

Figure 8A:
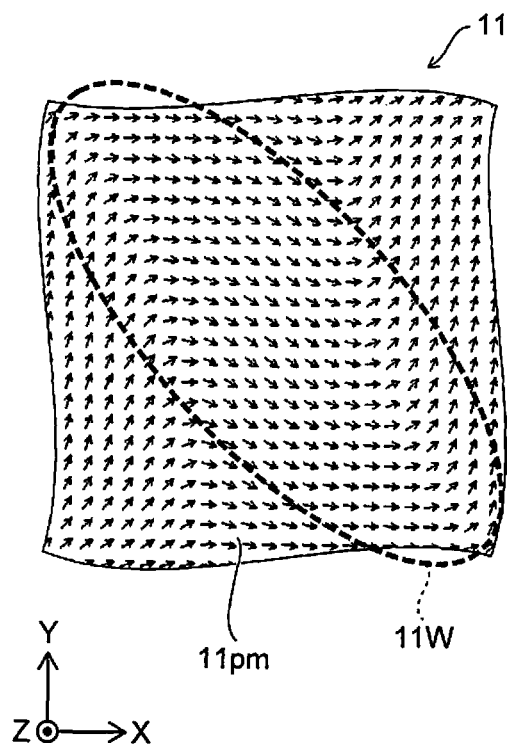
FIG. 8A to FIG. 8D are schematic views illustrating the electromagnetic wave attenuator.
Figure 8B:
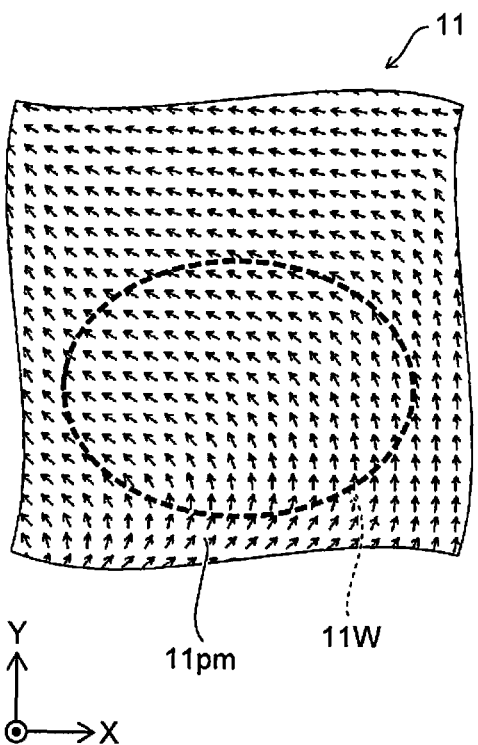
Figure 8C:
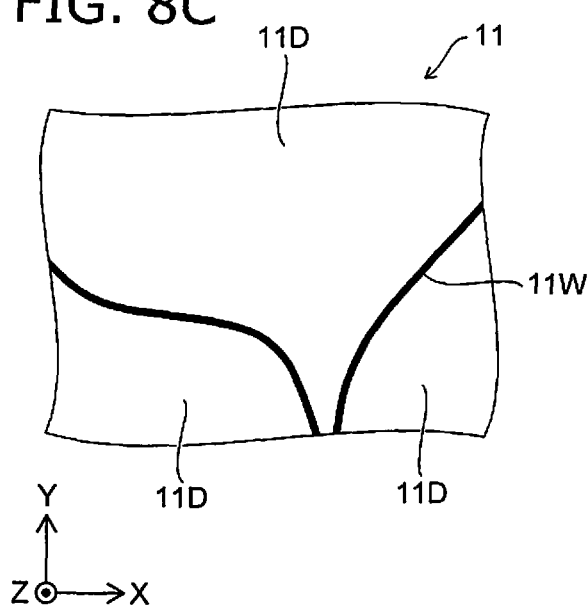
Figure 8D:
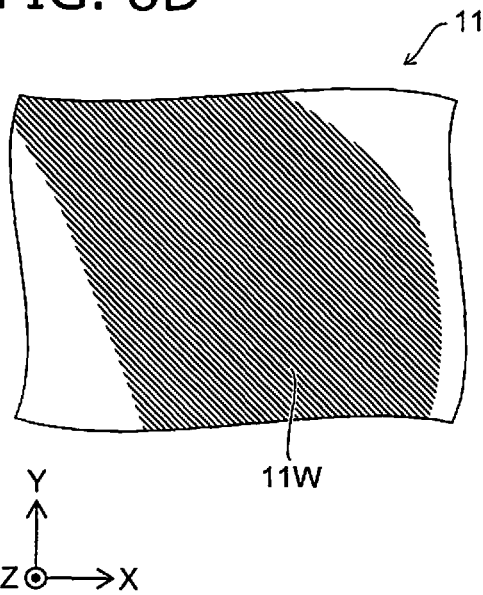

These figures illustrate a domain wall region 11W generated in the magnetic layer 11. As shown in FIG. 8A, the region where the magnetizations inside the magnetic layer 11 change inside the X-Y plane is the domain wall region 11W. As shown in FIG. 8B, the domain wall region may not be a slender region. As shown in FIG. 8C, the domain wall region 11W may have a fine line configuration occurring between multiple magnetic domains 11D. As shown in FIG. 8D, the greater part of the magnetic layer 11 may be the domain wall region 11W. The configurations of the domain wall region 11W and the magnetic domains 11D shown in FIG. 8A to FIG. 8D are due to, for example, the magnetic properties, the stacked structure, the defects, the unevenness, etc., of the magnetic layer. For example, the information that relates to the domain wall region 11W and the magnetic domains 11D is obtained by a polarizing microscope, etc.

There is a possibility that the attenuation at low frequencies f such as that illustrated in FIG. 2A, FIG. 2B, FIG. 3A, and FIG. 3B is caused by the domain wall region 11W.

In the embodiment, at least one of the multiple magnetic layers 11 may include crystal grains. The size of the crystal grains of the magnetic layer 11 can be reduced by providing the nonmagnetic layer 12 between the multiple magnetic layers 11.

Figure 9:
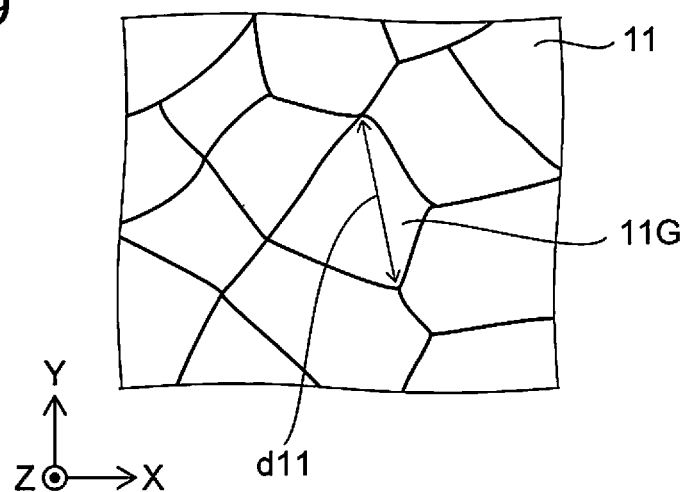
FIG. 9 is a schematic cross-sectional view illustrating the electromagnetic wave attenuator.

FIG. 9 is a schematic cross-sectional view illustrating the electromagnetic wave attenuator.

FIG. 9 schematically shows a cross section along the X-Y plane of one of the multiple magnetic layers 11. As shown in FIG. 9, the magnetic layer 11 includes multiple crystal grains 11G. The average value of the sizes (diameters d11) of the multiple crystal grains 11G is, for example, 40 nm or less. The diameter d11 is the length along one direction along the X-Y plane. The average value of the diameters d11 may be, for example, the average value of the long side and the short side in the case where each of the multiple crystal grains 11G is approximated by an ellipse. For example, in one example of calculating the average value, the average grain size may be obtained by a general grain size analysis technique in a field including ten or more crystal grains 11G in a cross section along the X-Y plane of one of the multiple magnetic layers 11. Or, for example, the average value of the diameters d11 of the multiple crystal grains 11G in the magnetic layer 11 may be determined by a technique using the Scherrer equation which is a general analysis technique of X-ray diffraction.

Generally, an exchange coupling interaction causes the orientations of the spins inside a ferromagnet body to be uniform. In the case where the magnetic body is a polycrystalline body, the exchange coupling interaction is small or zero at the crystal grain boundary. Accordingly, when an alternating-current magnetic field is applied to the magnetic body that is a polycrystalline body, the spins of the crystal grains 11G precess together as substantially one unit. By setting the average value of the diameters d11 to be small, e.g., 40 nm or less, the unit of the dynamic behavior is small; for example, the magnetostatic interaction between the layers, the magnetostatic interaction due to the unevenness, or the magnetostatic interaction due to the formation of the domain walls is stronger. Thereby, for example, it is considered that the attenuation characteristics for electromagnetic waves are improved easily. In the embodiment, the average value of the diameters d11 may be, for example, 20 nm. Thereby, for example, the attenuation characteristics for electromagnetic waves are improved more easily.

For example, the average value of the diameters d11 is about 30 nm when the nonmagnetic layer 12 is a Ta layer having a thickness of 5 nm and the magnetic layer 11 is a NiFeCuMo layer of 100 nm. For example, the average value of the diameters d11 is about 20 nm when the nonmagnetic layer 12 is a Ta layer having a thickness of 5 nm and the magnetic layer 11 is a NiFeCuMo layer of 50 nm. On the other hand, the average value of the diameters d11 is 47 nm when the magnetic layer 11 is a NiFeCuMo layer of 400 nm without providing the nonmagnetic layer 12.

In the embodiment, magnetic hysteresis may be observed in the magnetic layer 11.

Figure 10:
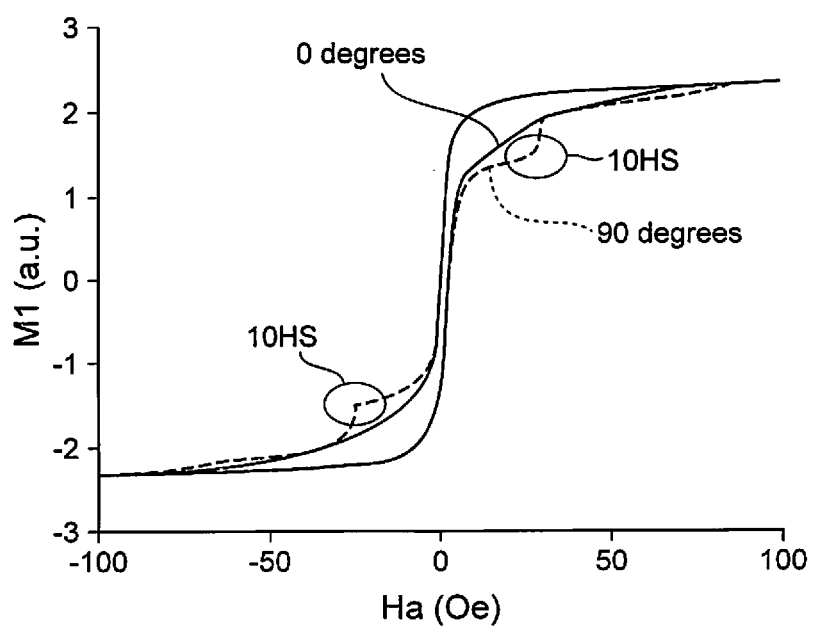
FIG. 10 is a graph illustrating magnetic properties of the electromagnetic wave attenuator.

FIG. 10 is a graph illustrating magnetic properties of the electromagnetic wave attenuator.

FIG. 10 illustrates the magnetic properties observed for the electromagnetic wave attenuator. In FIG. 10, the horizontal axis is a magnetic field Ha (Oe) applied to the electromagnetic wave attenuator 10 along one direction along the X-Y plane for the entire electromagnetic wave attenuator. The vertical axis is a magnetization M1 (arbitrary units).

FIG. 10 shows the characteristics of two cases in which the vibration directions of the magnetic field of the incident electromagnetic wave 81 are different. As shown in FIG. 1C, the angle between one direction (e.g., the X-axis direction) perpendicular to the Z-axis direction (the incident direction) and a vibration direction 81a of the magnetic field component of the electromagnetic wave 81 is taken as an angle θ. FIG. 10 shows the characteristics of the case where the angle θ of the vibration direction 81a of the magnetic field of the incident electromagnetic wave 81 is 0 degrees and the case where the angle θ is 90 degrees.

As shown in FIG. 10, a shoulder portion 10HS is observed in the characteristic of 90 degrees. For example, the shoulder portion 10HS means that the exchange coupling interaction and the magnetostatic interaction due to a portion (a portion of one of the multiple magnetic layers 11) having a coercivity of about 50 Oe causes a portion of an other one of the multiple magnetic layers 11 to undergo magnetization reversal. Or, the shoulder portion 10HS means that one portion (the magnetic domain 11D) of one of the multiple magnetic layers 11 undergoes magnetization reversal.

For example, when the absolute value of the magnetic field Ha is 5 Oe or less, the characteristic of 90 degrees has a good match with the characteristic of 0 degrees; and anisotropy is not observed in this region. On the other hand, when the absolute value of the magnetic field Ha exceeds 5 Oe, the characteristic of 90 degrees is different from the characteristic of 0 degrees. Anisotropy occurs in this region. It is considered that the anisotropy in the appearance of the shoulder portion 10HS is because different magnetic domains 11D are formed at least in two of the multiple magnetic layers 11.

For example, the magnetic properties illustrated in FIG. 10 are obtained by setting the first thickness t1 to be not less than ½ times the second thickness t2.

In the embodiment, the first thickness t1 (referring to FIG. 1A) is, for example, 20 nm or more. The second thickness t2 (referring to FIG. 1A) is, for example, 10 nm or more. By such thicknesses, for example, the magnitude of the demagnetizing field can be reduced; and the precession of the spin described above occurs easily. Thereby, for example, at least one of the magnetostatic interaction between the layers, the magnetostatic interaction due to the unevenness, or the magnetostatic interaction due to the formation of the domain walls described above is stronger. The attenuation characteristics for the electromagnetic wave 81 can be increased thereby. These thicknesses may be not less than 50 nm. These thicknesses may be, for example, not more than 500 nm. By setting these thicknesses to be thin, the manufacturing is easy. By setting these thicknesses to be thick, for example, the magnetostatic interaction can be stronger.

Figure 11A:
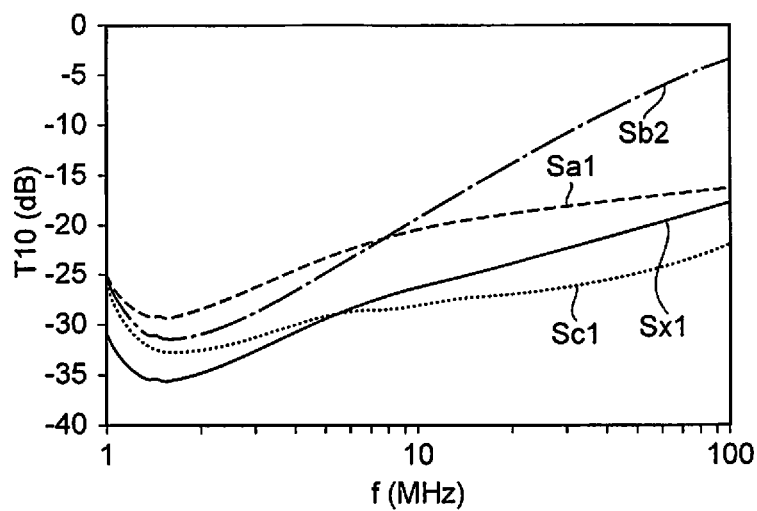
FIG. 11A and FIG. 11B are graphs illustrating characteristics of the electromagnetic wave attenuator.
Figure 11B:
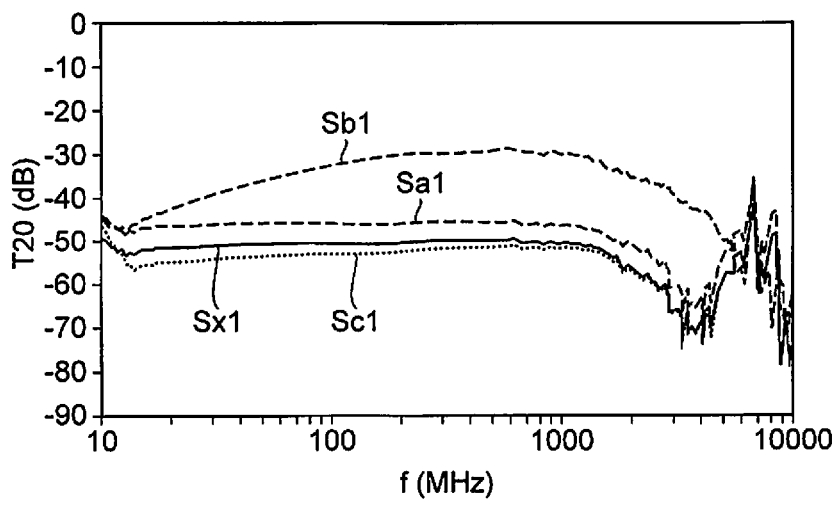

FIG. 11A and FIG. 11B are graphs illustrating characteristics of the electromagnetic wave attenuator.

These figures show the measurement results of the characteristic of a sample Sc1 in addition to the samples Sa1 and Sb1 described above. The sample Sa1 (10 pairs, with one pair being a NiFeCuMo layer of 100 nm and a Cu layer of 100 nm) and the sample Sb1 (37 pairs, with one pair being a NiFeCuMo layer of 50 nm and a Ta layer of 5 nm) are stacked in the sample Sc1. A characteristic Sx1 also is shown in FIG. 11A and FIG. 11B. The characteristic Sx1 is the transmission characteristic of a configuration in which the sample Sa1 and the sample Sb1 are stacked, and is determined by calculating using the transmission characteristic of the sample Sa1 and the transmission characteristic of the sample Sb1.

It can be seen from FIG. 11A and FIG. 11B that a better attenuation characteristic (the transmission characteristics T10 and T20 being low) is obtained for the sample Sc1 than for the sample Sa1 and the sample Sb1. Also, the transmission characteristic of the actual sample Sc1 is lower than the transmission characteristic of the characteristic Sx1 that is derived by calculation. It is considered that perhaps this is caused by the action of a magnetostatic interaction between the portion corresponding to the sample Sa1 and the portion corresponding to the sample Sb1 inside the sample Sc1.

For example, the transmission characteristic T10 at about 50 MHz is −17.6 dB for the sample Sa1, −7.4 dB for the sample Sb1, −25.0 dB for the sample Sc1, and −20.6 dB for the characteristic Sx1.

For example, the transmission characteristic T10 at about 20 MHz is −19.0 dB for the sample Sa1, −14.0 dB for the sample Sb1, −27.0 dB for the sample Sc1, and −23.8 dB for the characteristic Sx1.

Figure 12:
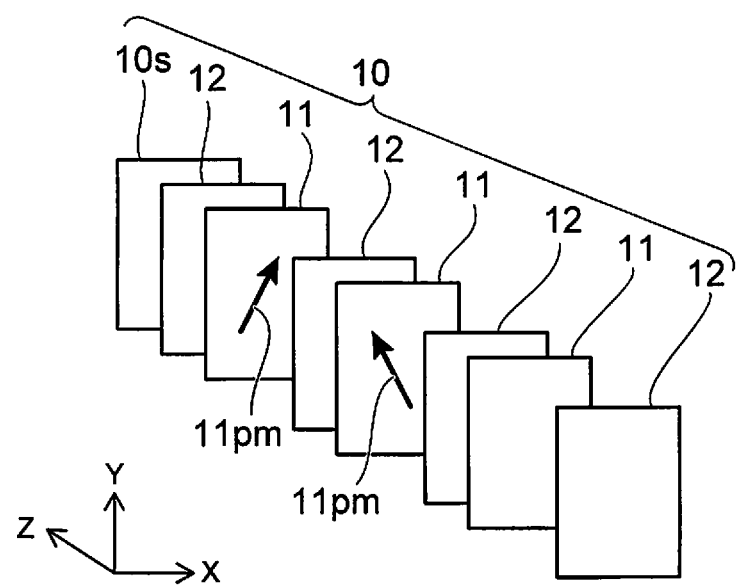
FIG. 12 is a schematic plan view illustrating the electromagnetic wave attenuator according to the first embodiment.

FIG. 12 is a schematic plan view illustrating the electromagnetic wave attenuator according to the first embodiment.

In FIG. 12, the positions of the multiple layers are illustrated as being shifted for easier viewing of the drawing. As shown in FIG. 12, at least a portion of each of the multiple magnetic layers 11 includes the magnetization 11pm (the easy magnetization axis). The orientation of the magnetization of at least a portion of one of the multiple magnetic layers 11 may cross the orientation of the magnetization of at least a portion of an other one of the multiple magnetic layers 11. Electromagnetic waves that have various vibration planes can be attenuated effectively thereby.

For example, the multiple magnetic layers 11 may be formed while applying a magnetic field. Easy magnetization axes in multiple directions can be obtained by modifying the direction of the magnetic field applied in the formation of one of the multiple magnetic layers 11 and the direction of the magnetic field applied in the formation of an other one of the multiple magnetic layers 11.

In the embodiment, the structures of the magnetizations such as those illustrated in FIG. 12 can be observed using, for example, a polarizing microscope, etc. For example, the magnetic hysteresis curve shown in FIG. 10 is obtained using such a structure of the magnetizations.

Figure 13:
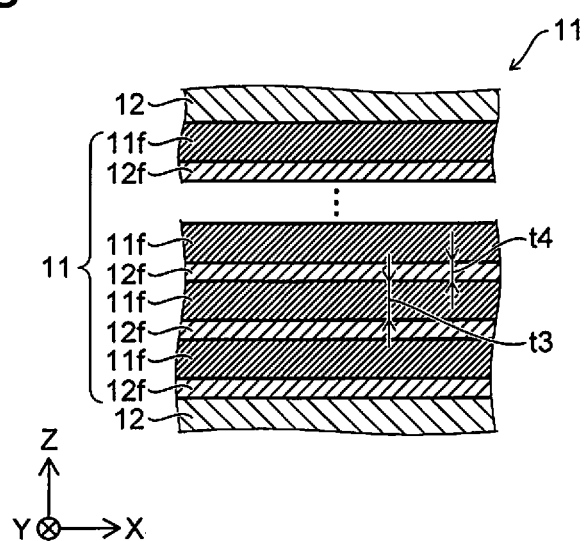
FIG. 13 is a schematic cross-sectional view illustrating the electromagnetic wave attenuator according to the first embodiment.

FIG. 13 is a schematic cross-sectional view illustrating the electromagnetic wave attenuator according to the first embodiment.

FIG. 13 illustrates one of the multiple magnetic layers 11. As shown in FIG. 13, at least one of the multiple magnetic layers 11 may include multiple magnetic films 11f and multiple nonmagnetic films 12f. The multiple magnetic films 11f and the multiple nonmagnetic films 12f are provided alternately along the first direction (the Z-axis direction). For example, the multiple nonmagnetic films 12f may be insulative or conductive. For example, the orientation from one of the multiple magnetic films 11f toward an other one of the multiple magnetic films 11f is aligned with the first direction. One of the multiple nonmagnetic films 12f is between one of the multiple magnetic films 11f and an other one of the multiple magnetic films 11f. For example, the multiple magnetic films 11f are arranged along the first direction. For example, the multiple nonmagnetic films 12f are arranged along the first direction.

A third thickness t3 along the first direction of one of the multiple magnetic films 11f is thicker than a fourth thickness t4 along the first direction of one of the multiple nonmagnetic films 12f. The fourth thickness t4 is, for example, not less than 0.5 nm and not more than 7 nm.

For example, the multiple nonmagnetic films 12f function as foundation layers. By forming one of the multiple magnetic films 11f on one of the multiple nonmagnetic films 12f, for example, good soft magnetic properties are obtained in the one of the multiple magnetic films 11f. For example, it is easy for an appropriate magnetic domain 11D or an appropriate domain wall region 11W to be formed in the multiple magnetic films 11f. For example, a high attenuation effect is obtained easily at low frequencies f.

At least a portion of at least one of the multiple magnetic films 11f includes at least one selected from the group consisting of Co, Ni, and Fe. For example, one of the multiple magnetic films 11f is a soft magnetic film.

At least a portion of at least one of the multiple nonmagnetic films 12f includes at least one selected from the group consisting of Cu, Ta, Ti, W, Mo, Nb, and Hf. At least one of the multiple nonmagnetic films 12f is, for example, a Cu film.

At least a portion of at least one of the multiple magnetic layers 11 includes at least one selected from the group consisting of Co, Ni, and Fe. One of the multiple magnetic layers 11 is, for example, a soft magnetic layer. At least a portion of at least one of the multiple magnetic layers 11 may further include at least one selected from the group consisting of Cu and Mo.

At least a portion of at least one of the multiple magnetic layers 11 may include $Fe_{100-x1-x2}\alpha_{x1}N_{x2}$. $\alpha$ includes, for example, at least one selected from the group consisting of Zr, Hf, Ta, Nb, Ti, Si, and Al. The composition ratio x1 is, for example, not less than 0.5 atomic percent and not more than 10 atomic percent. The composition ratio x2 is, for example, not less than 0.5 atomic percent and not more than 8 atomic percent.

At least a portion of at least one of the multiple magnetic layers 11 may include, for example, NiFe, CoFe, FeSi, FeZrN, FeCo, etc. At least a portion of at least one of the multiple magnetic layers 11 may include, for example, an amorphous alloy.

At least a portion of at least one of the multiple nonmagnetic layers 12 may include at least one selected from the group consisting of Cu, Al, Ni, Cr, Mn, Mo, Zr, and Si.

Second Embodiment

FIG. 14A to FIG. 14D are schematic views illustrating an electronic device according to a second embodiment.

Figure 14A:
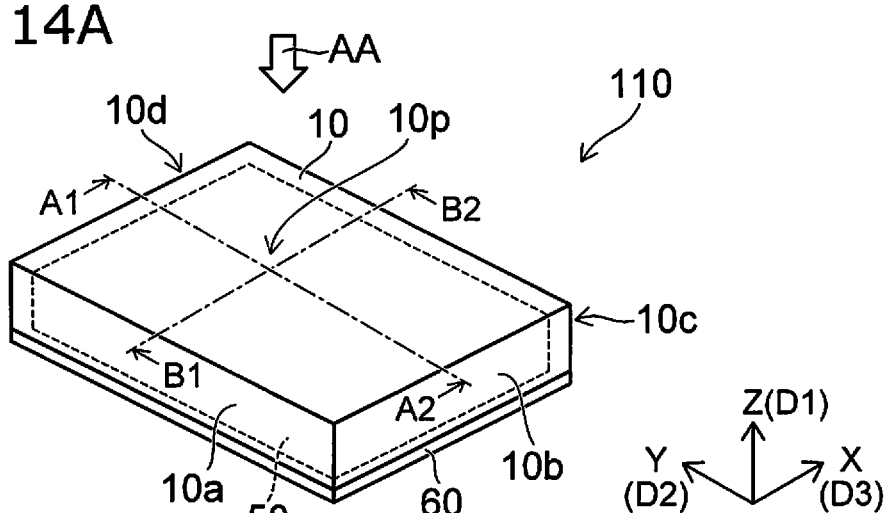
FIG. 14A to FIG. 14D are schematic views illustrating an electronic device according to a second embodiment.
Figure 14B:
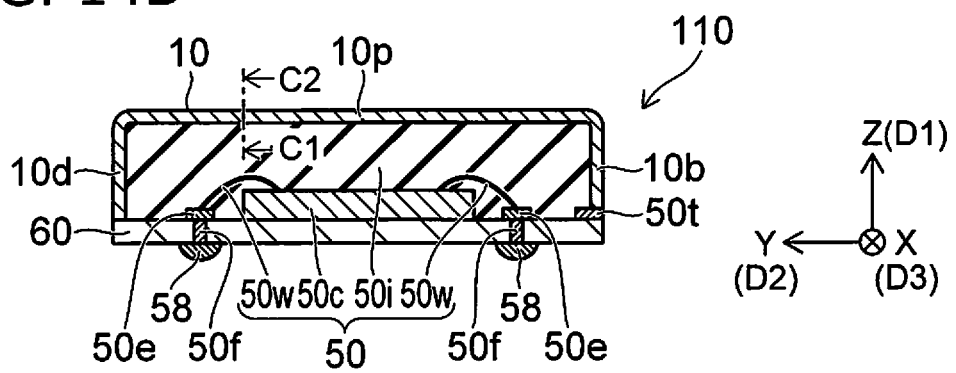
Figure 14C:
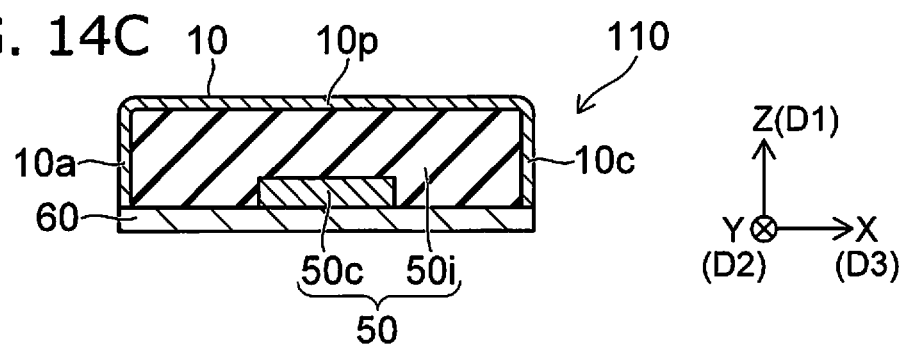
Figure 14D:
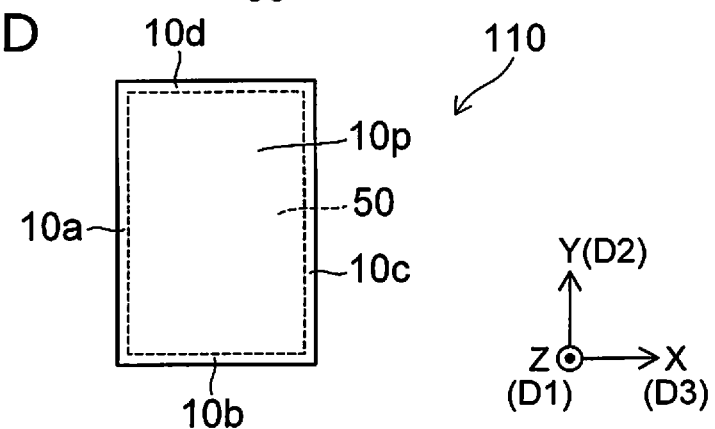

FIG. 14A is a perspective view. FIG. 14B is a line A1-A2 cross-sectional view of FIG. 14A. FIG. 14C is a line B1-B2 cross-sectional view of FIG. 14A. FIG. 14D is a plan view as viewed along arrow AA of FIG. 14A. FIG. 1A or FIG. 1B corresponds to a line C1-C2 cross section of FIG. 14B.

As shown in FIG. 14A, the electronic device 110 according to the second embodiment includes an electronic element 50 and the electromagnetic wave attenuator 10. A substrate 60 is further provided in the example. The electromagnetic wave attenuator 10 covers at least a portion of the electronic element 50. The electronic element 50 is, for example, a semiconductor element.

In the example as shown in FIG. 14B, the electronic element 50 includes a semiconductor chip 50c, an insulating portion 50i, and a wire 50w. In the example, an electrode 50e, a substrate connector 50f, and a connector 58 are provided at the substrate 60. The wire 50w electrically connects the electrode 50e and a portion of the semiconductor chip 50c. The electrode 50e and the connector 58 are electrically connected by the substrate connector 50f. The substrate connector 50f pierces the substrate 60. The connector 58 functions as an input/output portion of the semiconductor chip 50c. The connector 58 may be, for example, a terminal. The insulating portion 50i is provided around the semiconductor chip 50c. The insulating portion 50i includes, for example, at least one of a resin, a ceramic, etc. The semiconductor chip 50c is protected by the insulating portion 50i.

The electronic element 50 includes, for example, at least one of an arithmetic circuit, a control circuit, a memory circuit, a switching circuit, a signal processing circuit, or a high frequency circuit.

The base body 10s of the electromagnetic wave attenuator 10 (referring to FIG. 1A) may be, for example, the electronic element 50. The base body 10s of the electromagnetic wave attenuator 10 may be, for example, the insulating portion 50i.

In the example as illustrated in FIG. 14B, the electromagnetic wave attenuator 10 is electrically connected to a terminal 50t provided at the substrate 60. The electromagnetic wave attenuator 10 is set to a constant potential (e.g., the ground potential) via the terminal 50t. For example, the electromagnetic wave attenuator 10 attenuates the electromagnetic waves radiated from the electronic element 50. For example, the electromagnetic wave attenuator 10 functions as a shield.

As shown in FIG. 14A to FIG. 14C, the electromagnetic wave attenuator 10 includes a planar portion 10p and first to fourth side surface portions 10a to 10d. The direction from the electronic element 50 toward the planar portion 10p of the electromagnetic wave attenuator 10 is aligned with a first direction D1 (e.g., the Z-axis direction).

As shown in FIG. 14B and FIG. 14C, the electronic element 50 is positioned between the planar portion 10p and the substrate 60 in the first direction D1.

As shown in FIG. 14C and FIG. 14D, the electronic element 50 is positioned between the first side surface portion 10a and the third side surface portion 10c in the X-axis direction.

As shown in FIG. 14B and FIG. 14D, the electronic element 50 is positioned between the second side surface portion 10b and the fourth side surface portion 10d in the Y-axis direction.

By using the electromagnetic wave attenuator 10 described in reference to the first embodiment, for example, electromagnetic waves in the low frequency domain of 200 MHz or less can be attenuated effectively. An electronic device can be provided in which the attenuation characteristics for electromagnetic waves can be improved.

For example, the external emission of the electromagnetic waves generated by the electronic element 50 can be suppressed. The electromagnetic waves from the outside that reach the electronic element 50 can be suppressed. Stable operations are obtained easily in the electronic element 50.

The planar portion 10p may be, for example, substantially a quadrilateral (including a parallelogram, a rectangle, or a square).

FIG. 15A to FIG. 15D are schematic cross-sectional views illustrating portions of the electronic device according to the second embodiment.

Figure 15A:
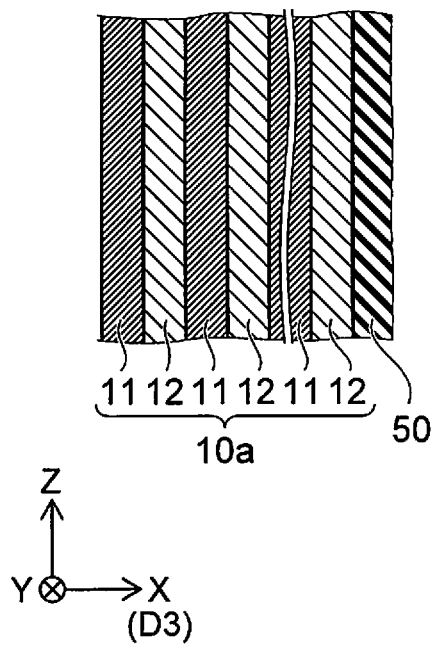
FIG. 15A to FIG. 15D are schematic cross-sectional views illustrating portions of the electronic device according to the second embodiment.

As shown in FIG. 15A, the first side surface portion 10a of the electromagnetic wave attenuator 10 includes the multiple magnetic layers 11 and the multiple nonmagnetic layers 12. The stacking direction of the multiple magnetic layers 11 and the multiple nonmagnetic layers 12 in the first side surface portion 10a is a third direction D3.

Figure 15B:
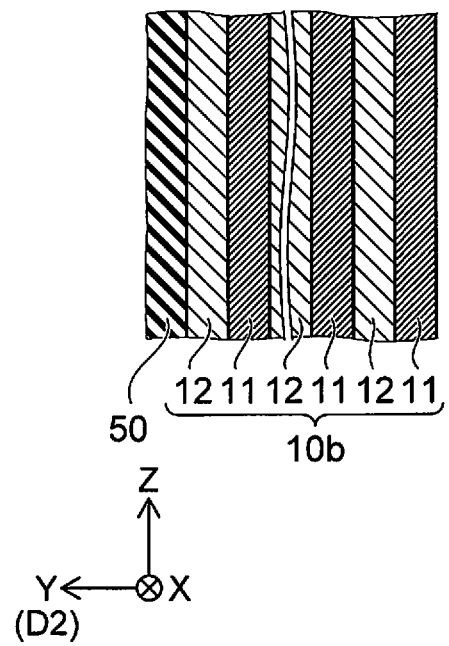

As shown in FIG. 15B, the second side surface portion 10b of the electromagnetic wave attenuator 10 includes the multiple magnetic layers 11 and the multiple nonmagnetic layers 12. The stacking direction of the multiple magnetic layers 11 and the multiple nonmagnetic layers 12 in the second side surface portion 10b is a second direction D2.

Figure 15C:
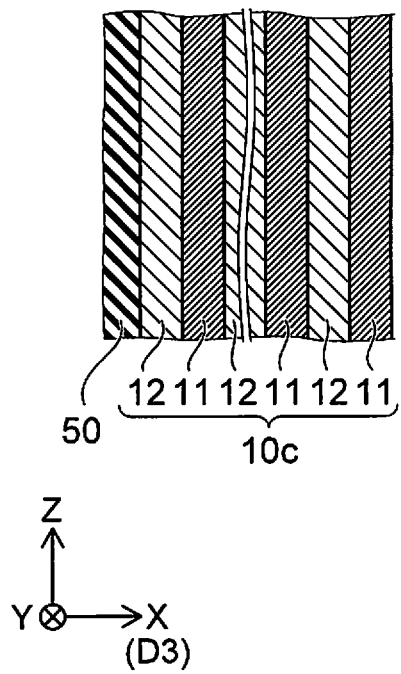

As shown in FIG. 15C, the third side surface portion 10c of the electromagnetic wave attenuator 10 includes the multiple magnetic layers 11 and the multiple nonmagnetic layers 12. The stacking direction of the multiple magnetic layers 11 and the multiple nonmagnetic layers 12 in the third side surface portion 10c is the third direction D3.

Figure 15D:
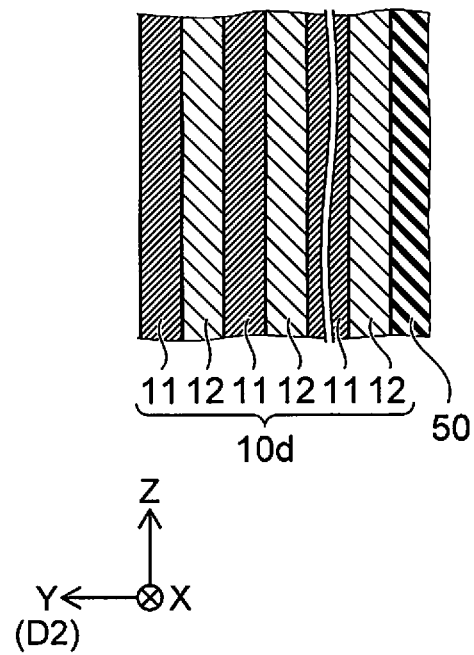

As shown in FIG. 15D, the fourth side surface portion 10d of the electromagnetic wave attenuator 10 includes the multiple magnetic layers 11 and the multiple nonmagnetic layers 12. The stacking direction of the multiple magnetic layers 11 and the multiple nonmagnetic layers 12 in the fourth side surface portion 10d is the second direction D2.

The magnetic layers 11 that are included in the first to fourth side surface portions 10a to 10d each may be continuous with the magnetic layer 11 included in the planar portion 10p.

The nonmagnetic layers 12 that are included in the first to fourth side surface portions 10a to 10d each may be continuous with the nonmagnetic layer 12 included in the planar portion 10p.

Thus, the electronic device 110 according to the embodiment includes the electronic element 50 and the electromagnetic wave attenuator 10 according to the first embodiment. For example, the direction from the electronic element 50 toward the electromagnetic wave attenuator 10 is the first direction (the Z-axis direction).

For example, the electromagnetic wave attenuator 10 includes multiple regions (or multiple portions). At least a portion of the electronic element 50 is provided between the multiple regions. Multiple electromagnetic wave attenuators 10 may be provided. For example, the multiple electromagnetic wave attenuators 10 corresponds to the planar portion 10p and the first to fourth side surface portions 10a to 10d. For example, at least a portion of the electronic element 50 may be provided between the multiple electromagnetic wave attenuators 10.

FIG. 16 to FIG. 21 are schematic cross-sectional views illustrating electronic devices according to the second embodiment.

Figure 16:
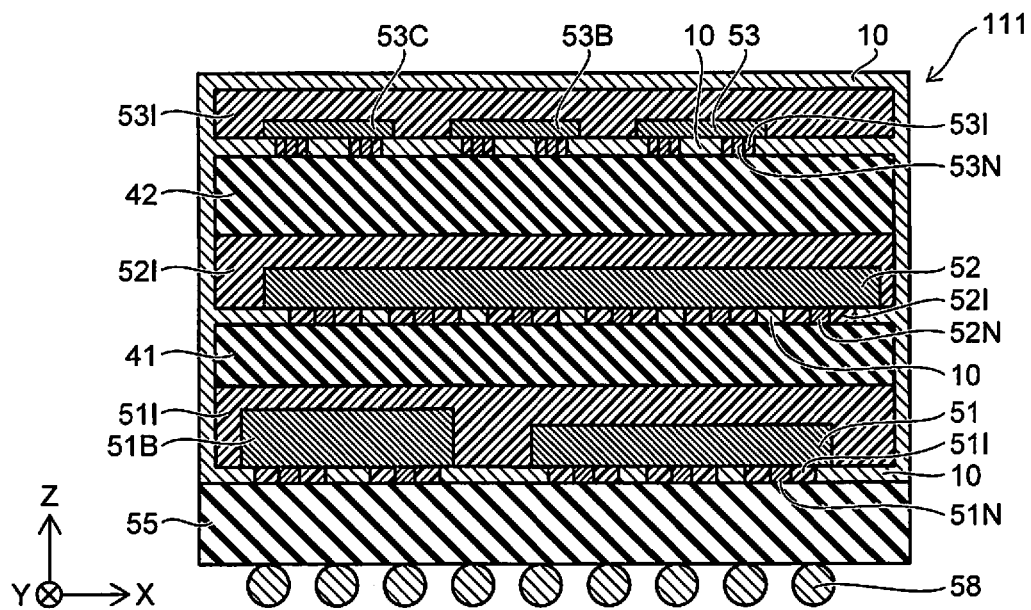
FIG. 16 is a schematic cross-sectional view illustrating electronic devices according to the second embodiment.

As shown in FIG. 16, an electronic device 111 according to the embodiment includes the electromagnetic wave attenuator 10 and multiple electronic elements (electronic elements 51, 51B, 52, 53, 53B, 53C, etc.).

The electronic elements are provided between multiple regions of the electromagnetic wave attenuator 10. An insulating region (insulating portions 41 and 42, etc.) may be provided between the electronic element and one of the multiple regions of the electromagnetic wave attenuator 10. A resin portion (resin portions 51I, 52I, 53I, etc.) may be provided between the electronic element and the insulating region (the insulating portions 41 and 42, etc.). A connection member (connection members 51N, 52N, 53N, etc.) may be provided for each of the multiple electronic elements. For example, the electronic element and the connector 58 may be electrically connected by the connection member.

Figure 17:
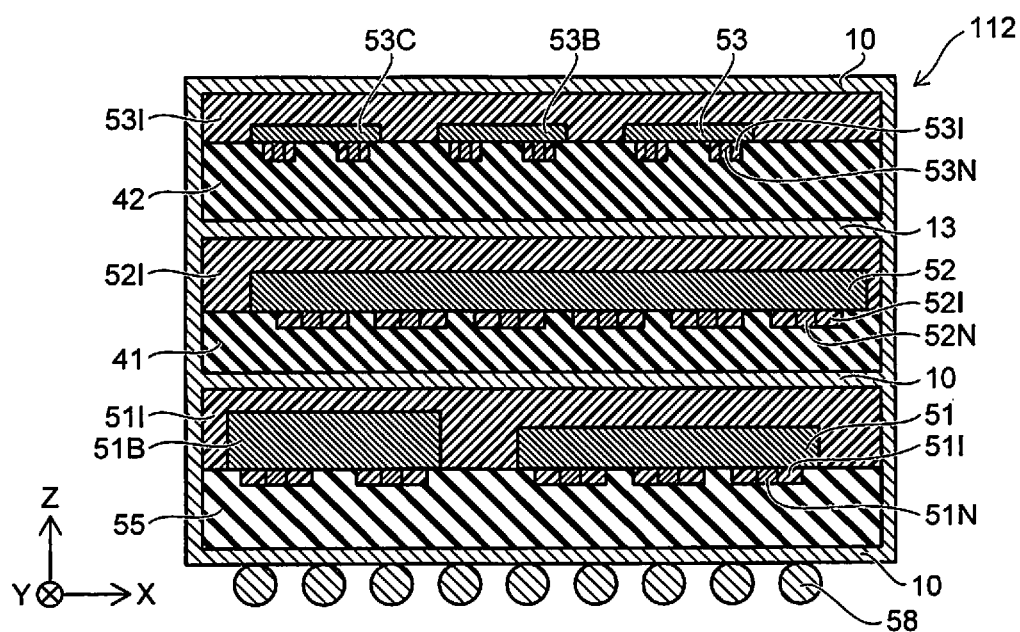
FIG. 17 is a schematic cross-sectional view illustrating electronic devices according to the second embodiment.

As in an electronic device 112 shown in FIG. 17, the connection member 51N may be sunk into a substrate 55.

Figure 18:
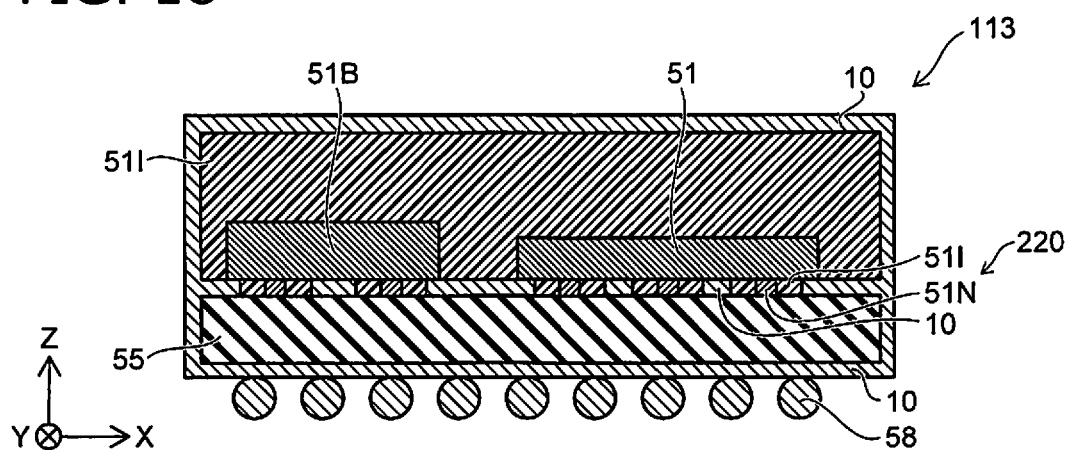
FIG. 18 is a schematic cross-sectional view illustrating electronic devices according to the second embodiment.

As in an electronic device 113 shown in FIG. 18, a mounting member 220 may be provided. The mounting member 220 includes the substrate 55 and the electromagnetic wave attenuator 10. Electronic elements (the electronic elements 51 and 51B) are provided between the mounting member 220 and an other electromagnetic wave attenuator 10.

Figure 19:
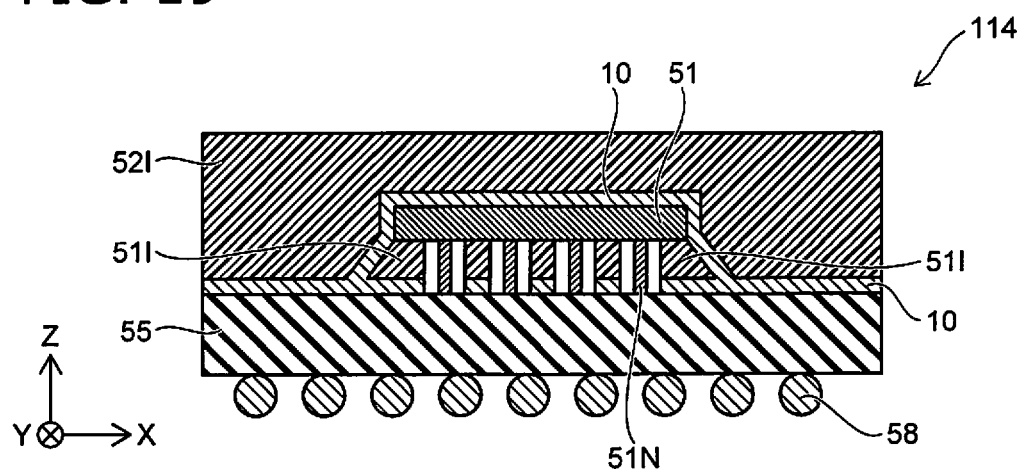
FIG. 19 is a schematic cross-sectional view illustrating electronic devices according to the second embodiment.

As in an electronic device 114 shown in FIG. 19, the electromagnetic wave attenuator 10 may be provided at the side surface of the electronic element 51. The side surface crosses the X-Y plane.

Figure 20:
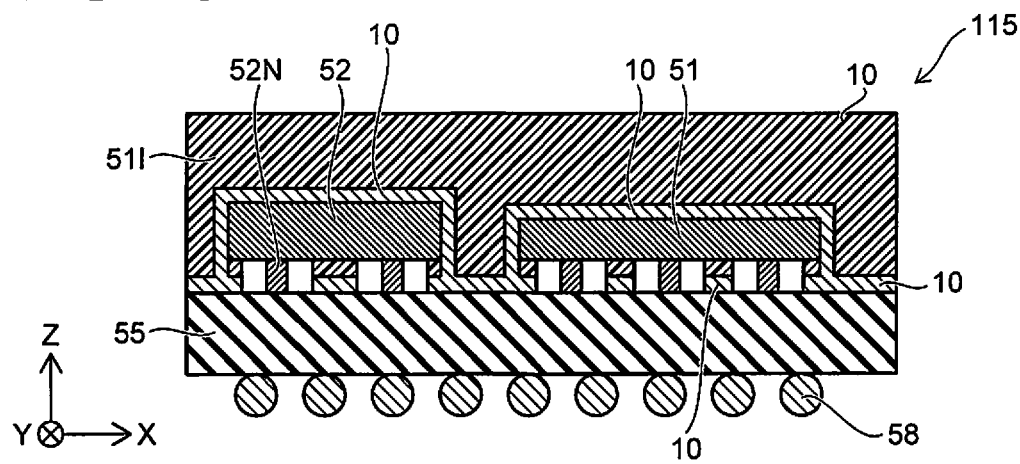
FIG. 20 is a schematic cross-sectional view illustrating electronic devices according to the second embodiment.

As in an electronic device 115 shown in FIG. 20, the electromagnetic wave attenuator 10 may be provided to continuously surround multiple electronic elements (the electronic elements 51 and 52).

Figure 21:
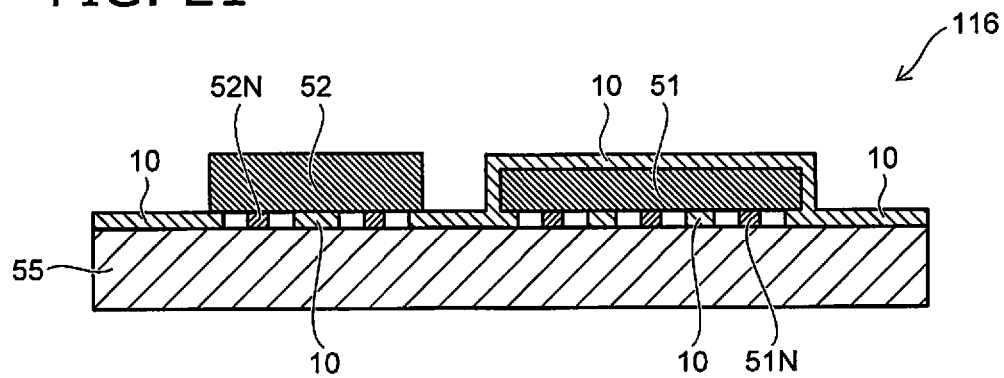
FIG. 21 is a schematic cross-sectional view illustrating electronic devices according to the second embodiment.

As in an electronic device 116 shown in FIG. 21, one of the multiple electronic elements (the electronic element 51) is provided between multiple regions of the electromagnetic wave attenuator 10. An other one of the multiple electronic elements (the electronic element 52) may not be provided between the multiple regions of the electromagnetic wave attenuator 10.

According to the electronic devices 111 to 116 as well, an electronic device can be provided in which the attenuation characteristics for electromagnetic waves can be improved.

For example, the embodiments are applicable to an electronic device and an electromagnetic wave attenuator for EMC (ElectroMagnetic Compatibility).

The embodiments may include the following configurations (e.g., technological proposals).

Configuration 1

An electromagnetic wave attenuator, comprising:
a plurality of magnetic layers; and
a plurality of nonmagnetic layers, the plurality of nonmagnetic layers being conductive,
a direction from one of the plurality of magnetic layers toward an other one of the plurality of magnetic layers being aligned with a first direction,
one of the plurality of nonmagnetic layers being between the one of the plurality of magnetic layers and the other one of the plurality of magnetic layers,
a first thickness along the first direction of the one of the plurality of magnetic layers being not less than ½ times a second thickness along the first direction of the one of the plurality of nonmagnetic layers,
a number of the plurality of magnetic layers being 3 or more.

Configuration 2

The electromagnetic wave attenuator according to Configuration 1, wherein
the one of the plurality of magnetic layers includes crystal grains, and
an average value of diameters of the crystal grains is 40 nm or less.

Configuration 3

The electromagnetic wave attenuator according to Configuration 1 or 2, wherein
the one of the plurality of magnetic layers has a first surface opposing the one of the plurality of nonmagnetic layers,
the first surface includes a first top portion and a first bottom portion, and
a distance along the first direction between the first top portion and the first bottom portion is 10 nm or more.

Configuration 4

The electromagnetic wave attenuator according to Configuration 3, wherein the distance is 10 μm or less.

Configuration 5

The electromagnetic wave attenuator according to Configuration 1 or 2, wherein
the one of the plurality of magnetic layers has a first surface opposing the one of the plurality of nonmagnetic layers,
the first surface includes a first top portion, a second top portion, and a first bottom portion,
a position of the first bottom portion in a second direction is between a position of the first top portion in the second direction and a position of the second top portion in the second direction, the second direction crossing the first direction, and at least a portion of the one of the plurality of nonmagnetic layers is between the first top portion and the second top portion in the second direction.

Configuration 6

The electromagnetic wave attenuator according to any one of Configurations 1 to 5, wherein the at least one of the plurality of magnetic layers includes a domain wall.

Configuration 7

The electromagnetic wave attenuator according to any one of Configurations 1 to 6, wherein
the first thickness is 20 nm or more, and
the second thickness is 10 nm or more.

Configuration 8

The electromagnetic wave attenuator according to any one of Configurations 1 to 7, wherein
the at least one of the plurality of magnetic layers includes a plurality of magnetic films and a plurality of nonmagnetic films,
a direction from one of the plurality of magnetic films toward an other one of the plurality of magnetic films is aligned with the first direction,
one of the plurality of nonmagnetic films is between the one of the plurality of magnetic films and the other one of the plurality of magnetic films,
a third thickness along the first direction of the one of the plurality of magnetic films is thicker than a fourth thickness along the first direction of the one of the plurality of nonmagnetic films, and
the fourth thickness is not less than 0.5 nm and not more than 7 nm.

Configuration 9

The electromagnetic wave attenuator according to Configuration 8, wherein at least a portion of the at least one of the plurality of nonmagnetic films includes at least one selected from the group consisting of Cu, Ta, Ti, W, Mo, Nb, and Hf.

Configuration 10

The electromagnetic wave attenuator according to Configuration 8 or 9, wherein at least a portion of the at least one of the plurality of magnetic films includes at least one selected from the group consisting of Co, Ni, and Fe.

Configuration 11

The electromagnetic wave attenuator according to any one of Configurations 1 to 10, wherein at least a portion of the at least one of the plurality of magnetic layers includes at least one selected from the group consisting of Co, Ni, and Fe.

Configuration 12

The electromagnetic wave attenuator according to Configuration 11, wherein the at least a portion of the at least one of the plurality of magnetic layers further includes at least one selected from the group consisting of Cu and Mo.

Configuration 13

The electromagnetic wave attenuator according to any one of Configurations 1 to 11, wherein
at least a portion of the at least one of the plurality of magnetic layers includes $Fe_{100-x1-x2}\alpha_{x1}N_{x2}$, and
α includes at least one selected from the group consisting of Zr, Hf, Ta, Nb, Ti, Si, and Al.

Configuration 14

The electromagnetic wave attenuator according to any one of Configurations 1 to 13, wherein the at least a portion of the at least one of the plurality of nonmagnetic layers further includes at least one selected from the group consisting of Cu, Al, Ni, Cr, Mn, Mo, Zr, and Si.

Configuration 15

The electromagnetic wave attenuator according to any one of Configurations 1 to 14, wherein an orientation of a magnetization of at least a portion of one of the plurality of magnetic layers crosses an orientation of a magnetization of at least a portion of an other one of the plurality of magnetic layers.

Configuration 16

An electronic device, comprising:
the electromagnetic wave attenuator according to any one of Configurations 1 to 15; and
an electronic element.

Configuration 17

The electronic device according to Configuration 16, wherein at least one of the plurality of magnetic layers and/or the plurality of nonmagnetic layers is grounded.

Configuration 18

The electronic device according to Configuration 16 or 17, wherein
the electromagnetic wave attenuator includes a plurality of regions, and
at least a portion of the electronic element is provided between the plurality of regions.

Configuration 19

The electronic device according to Configuration 16 or 17, wherein
a plurality of the electromagnetic wave attenuators is provided, and
at least a portion of the electronic element is provided between the plurality of electromagnetic wave attenuators.

According to the embodiments, an electromagnetic wave attenuator and an electronic device can be provided in which the attenuation characteristics for electromagnetic waves can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electromagnetic wave attenuators such as magnetic layers, nonmagnetic layers, and included in electronic devices such as electronic elements, semiconductor chips, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electromagnetic wave attenuators, and electronic devices practicable by an appropriate design modification by one skilled in the art based on the electromagnetic wave attenuators, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electromagnetic wave attenuator, comprising:
a plurality of magnetic layers; and
a plurality of nonmagnetic layers, the plurality of nonmagnetic layers being conductive,
a direction from one of the plurality of magnetic layers toward an other one of the plurality of magnetic layers being aligned with a first direction,
one of the plurality of nonmagnetic layers being between the one of the plurality of magnetic layers and the other one of the plurality of magnetic layers,
a first thickness along the first direction of the one of the plurality of magnetic layers being not less than ½ times a second thickness along the first direction of the one of the plurality of nonmagnetic layers,
a number of the plurality of magnetic layers being 3 or more,
wherein
the one of the plurality of magnetic layers has a first surface opposing the one of the plurality of nonmagnetic layers,
the first surface includes a first top portion and a first bottom portion, and
a distance along the first direction between the first top portion and the first bottom portion is 10 nm or more.

2. The attenuator according to claim 1, wherein
the one of the plurality of magnetic layers includes crystal grains, and
an average value of diameters of the crystal grains is 40 nm or less.

3. The attenuator according to claim 1, wherein the distance is 10 μm or less.

4. An electromagnetic wave attenuator, comprising:
a plurality of magnetic layers; and
a plurality of nonmagnetic layers, the plurality of nonmagnetic layers being conductive,
a direction from one of the plurality of magnetic layers toward an other one of the plurality of magnetic layers being aligned with a first direction,
one of the plurality of nonmagnetic layers being between the one of the plurality of magnetic layers and the other one of the plurality of magnetic layers,
a first thickness along the first direction of the one of the plurality of magnetic layers being not less than ½ times a second thickness along the first direction of the one of the plurality of nonmagnetic layers,
a number of the plurality of magnetic layers being 3 or more,
wherein
the one of the plurality of magnetic layers has a first surface opposing the one of the plurality of nonmagnetic layers,
the first surface includes a first top portion, a second top portion, and a first bottom portion,
a position of the first bottom portion in a second direction is between a position of the first top portion in the second direction and a position of the second top portion in the second direction, the second direction crossing the first direction; and
at least a portion of the one of the plurality of nonmagnetic layers is between the first top portion and the second top portion in the second direction.

5. The attenuator according to claim 1, wherein at least one of the plurality of magnetic layers includes a domain wall.

6. The attenuator according to claim 1, wherein
the first thickness is 20 nm or more, and
the second thickness is 10 nm or more.

7. An electromagnetic wave attenuator, comprising:
a plurality of magnetic layers; and
a plurality of nonmagnetic layers, the plurality of nonmagnetic layers being conductive,
a direction from one of the plurality of magnetic layers toward an other one of the plurality of magnetic layers being aligned with a first direction,
one of the plurality of nonmagnetic layers being between the one of the plurality of magnetic layers and the other one of the plurality of magnetic layers,
a first thickness along the first direction of the one of the plurality of magnetic layers being not less than ½ times a second thickness along the first direction of the one of the plurality of nonmagnetic layers,
a number of the plurality of magnetic layers being 3 or more,
wherein
at least one of the plurality of magnetic layers includes a plurality of magnetic films and a plurality of nonmagnetic films,
a direction from one of the plurality of magnetic films toward an other one of the plurality of magnetic films is aligned with the first direction,
one of the plurality of nonmagnetic films is between the one of the plurality of magnetic films and the other one of the plurality of magnetic films,
a third thickness along the first direction of the one of the plurality of magnetic films is thicker than a fourth thickness along the first direction of the one of the plurality of nonmagnetic films, and the fourth thickness is not less than 0.5 nm and not more than 7 nm.

8. The attenuator according to claim 7, wherein at least a portion of at least one of the plurality of nonmagnetic films includes at least one selected from the group consisting of Cu, Ta, Ti, W, Mo, Nb, and Hf.

9. The attenuator according to claim 7, wherein at least a portion of at least one of the plurality of magnetic films includes at least one selected from the group consisting of Co, Ni, and Fe.

10. The attenuator according to claim 1, wherein at least a portion of at least one of the plurality of magnetic layers includes at least one selected from the group consisting of Co, Ni, and Fe.

11. The attenuator according to claim 10, wherein the at least a portion of the at least one of the plurality of magnetic layers further includes at least one selected from the group consisting of Cu and Mo.

12. The attenuator according to claim 1, wherein
at least a portion of at least one of the plurality of magnetic layers includes $Fe_{100-x1-x2}\alpha_{x1}N_{x2}$, and
$\alpha$ includes at least one selected from the group consisting of Zr, Hf, Ta, Nb, Ti, Si, and Al.

13. The attenuator according to claim 1, wherein at least a portion of the at least one of the plurality of nonmagnetic layers further includes at least one selected from the group consisting of Cu, Al, Ni, Cr, Mn, Mo, Zr, and Si.

14. The attenuator according to claim 1, wherein an orientation of a magnetization of at least a portion of one of the plurality of magnetic layers crosses an orientation of a magnetization of at least a portion of an other one of the plurality of magnetic layers.

15. An electronic device, comprising:
the electromagnetic wave attenuator according to claim 1; and
an electronic element.

16. The device according to claim 15, wherein at least one of the plurality of magnetic layers and/or the plurality of nonmagnetic layers is grounded.

17. The device according to claim 15, wherein
the electromagnetic wave attenuator includes a plurality of regions, and
at least a portion of the electronic element is provided between the plurality of regions.

18. The device according to claim 15, wherein
a plurality of the electromagnetic wave attenuators is provided, and
at least a portion of the electronic element is provided between the plurality of electromagnetic wave attenuators.

19. The attenuator according to claim 1, wherein
the one of the plurality of magnetic layers has a first surface opposing the one of the plurality of nonmagnetic layers,
the first surface includes a first top portion, a second top portion, and a first bottom portion,
a position of the first bottom portion in a second direction is between a position of the first top portion in the second direction and a position of the second top portion in the second direction, the second direction crossing the first direction; and
at least a portion of the one of the plurality of nonmagnetic layers is between the first top portion and the second top portion in the second direction.

20. The attenuator according to claim 1, wherein
at least one of the plurality of magnetic layers includes a plurality of magnetic films and a plurality of nonmagnetic films,
a direction from one of the plurality of magnetic films toward an other one of the plurality of magnetic films is aligned with the first direction,
one of the plurality of nonmagnetic films is between the one of the plurality of magnetic films and the other one of the plurality of magnetic films,
a third thickness along the first direction of the one of the plurality of magnetic films is thicker than a fourth thickness along the first direction of the one of the plurality of nonmagnetic films, and
the fourth thickness is not less than 0.5 nm and not more than 7 nm.

* * * * *